(12) United States Patent
Yoshinaga et al.

(10) Patent No.: US 9,529,042 B2
(45) Date of Patent: Dec. 27, 2016

(54) DEVICE FOR AND METHOD OF ESTIMATING ERROR POINT IN LOGIC DIAGRAM

(71) Applicant: Mitsubishi Electric Corporation, Tokyo (JP)

(72) Inventors: Mitsunobu Yoshinaga, Tokyo (JP); Tadashi Oi, Tokyo (JP); Shinichiro Tsudaka, Tokyo (JP); Masayo Nakagawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 80 days.

(21) Appl. No.: 14/414,991

(22) PCT Filed: Jul. 12, 2013

(86) PCT No.: PCT/JP2013/069145
§ 371 (c)(1),
(2) Date: Jan. 15, 2015

(87) PCT Pub. No.: WO2014/024640
PCT Pub. Date: Feb. 13, 2014

(65) Prior Publication Data
US 2015/0177322 A1   Jun. 25, 2015

(30) Foreign Application Priority Data

Aug. 8, 2012 (JP) ................................. 2012-175932

(51) Int. Cl.
*G01R 31/28* (2006.01)
*G01R 31/3177* (2006.01)
*G05B 19/05* (2006.01)

(52) U.S. Cl.
CPC ........... *G01R 31/3177* (2013.01); *G05B 19/05* (2013.01)

(58) Field of Classification Search
CPC ............................ G01R 31/3177; G05B 19/05
See application file for complete search history.

(56) References Cited

U.S. PATENT DOCUMENTS 6,301,685 B1   10/2001   Shigeta
6,397,362 B1 *  5/2002   Ishiyama ....... G01B 31/318392
                                                          714/724

(Continued)

FOREIGN PATENT DOCUMENTS

CN   102103589 A   6/2011
CN   102479175 A   5/2012

(Continued)

OTHER PUBLICATIONS

International Preliminary Report on Patentability and Written Opinion issued on Feb. 19, 2015 PCT/JP2013/069145 with English translation.
International Search Report Issued Aug. 13, 2013 in PCT/JP13/069145 Filed Jul. 12, 2013.

(Continued)

*Primary Examiner* — April Y Blair
*Assistant Examiner* — Thien D Nguyen
(74) *Attorney, Agent, or Firm* — Oblon, McClelland, Maier & Neustadt, L.L.P.

(57) ABSTRACT

A technique capable of estimating an error point in a logic diagram appropriately. A logic diagram display device includes: a signal line correctness/incorrectness determining unit that determines for each test whether each signal line in the logic diagram is correct or incorrect based on a signal line status value of each signal line and a test table; and a signal line correctness/incorrectness result summarizing unit that calculates a correctness/incorrectness result summarized value of each signal line based on a result of determination about the correctness or incorrectness of each signal line. The logic diagram display device further includes: an error signal line estimating unit that estimates an error in each signal line based on the correctness/

(Continued)

incorrectness result summarized value of each signal line; and a display that displays each signal line in the logic diagram in a display style responsive to the error in each signal line.

7 Claims, 37 Drawing Sheets

(56) References Cited

U.S. PATENT DOCUMENTS

| | | | |
|---|---|---|---|
| 6,915,494 B2 | 7/2005 | Shigeta | |
| 2001/0011360 A1* | 8/2001 | Shigeta | G01R 31/3181 714/724 |
| 2012/0136608 A1 | 5/2012 | Yoshinaga et al. | |

FOREIGN PATENT DOCUMENTS

| | | |
|---|---|---|
| JP | 7 271287 | 10/1995 |
| JP | 3137056 | 2/2001 |
| JP | 2001 92504 | 4/2001 |
| JP | 2001 337143 | 12/2001 |
| JP | 2002 228714 | 8/2002 |
| JP | 3863423 | 12/2006 |
| JP | 2011 118552 | 6/2011 |
| JP | 2012 113538 | 6/2012 |

OTHER PUBLICATIONS

Combined Chinese Office Action and Search Report issued Apr. 5, 2016 in Patent Application No. 201380041755.X (with partial English translation).

* cited by examiner

F I G. 1
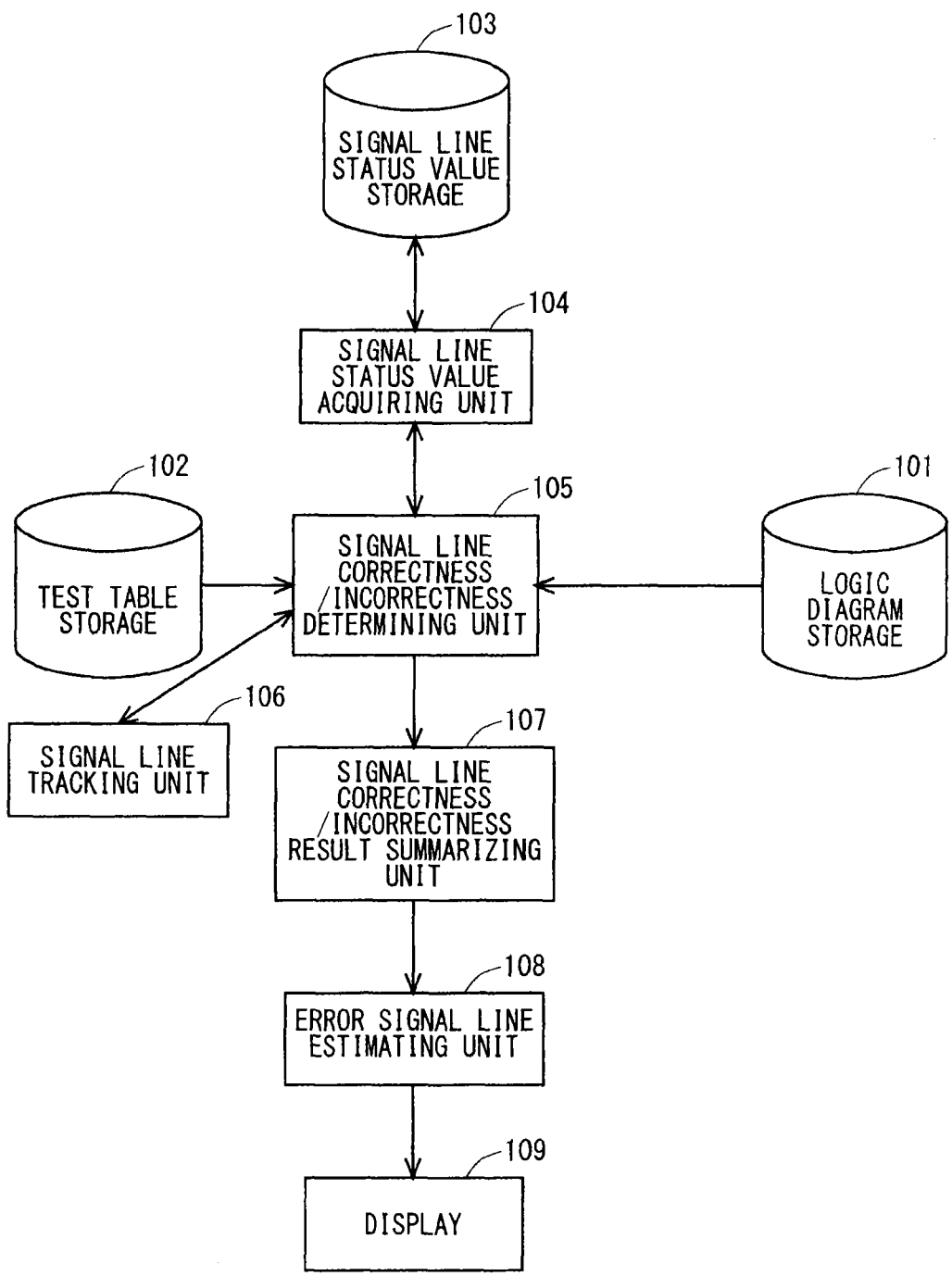

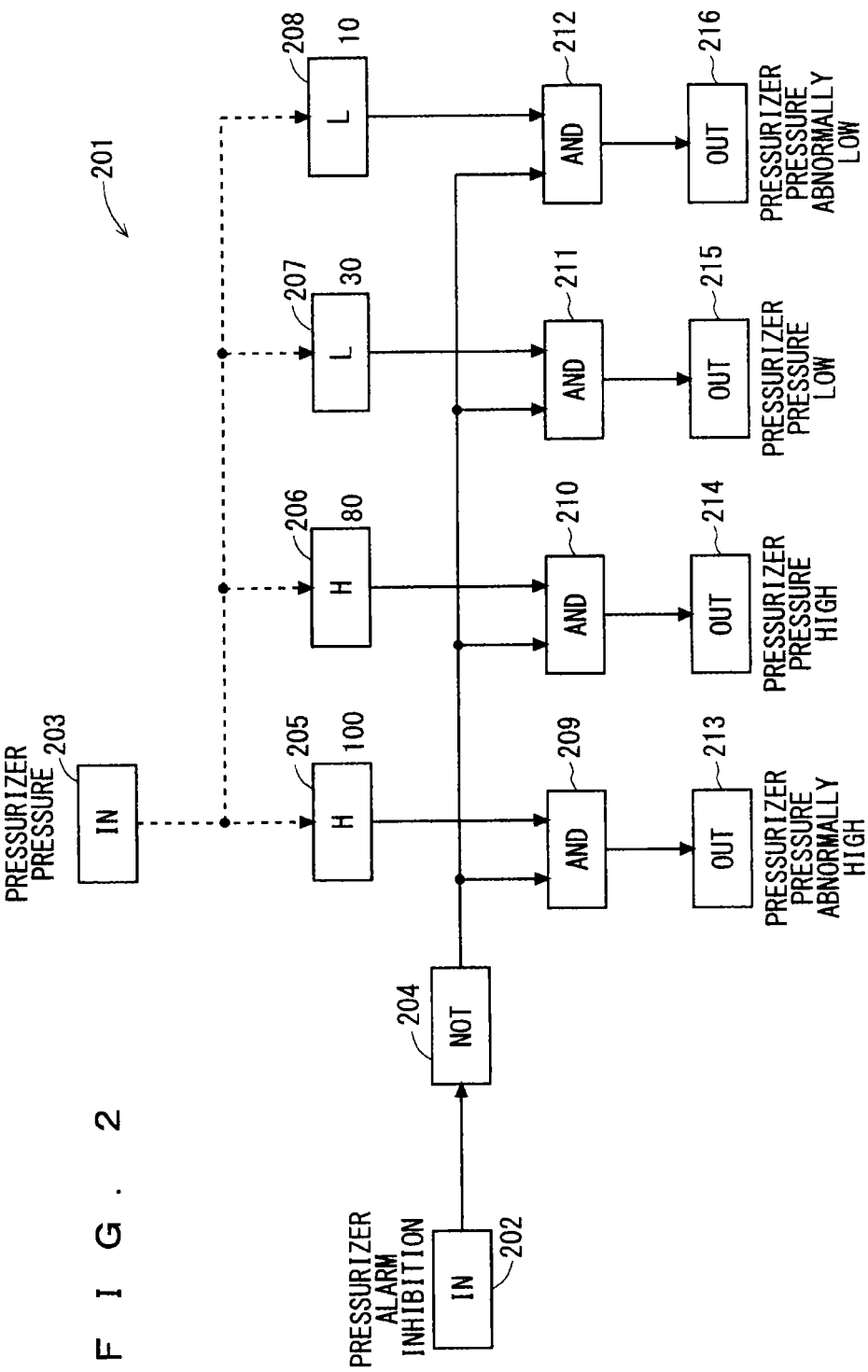

FIG. 3

| ARITHMETIC ELEMENT | | DESCRIPTION |
|---|---|---|
| INPUT OPERATOR | IN SIGNAL NAME | SIGNAL INPUT FROM OUTSIDE |
| OUTPUT OPERATOR | OUT SIGNAL NAME | SIGNAL OUTPUT TO OUTSIDE |
| JUMP OPERATOR | JUMP⟩SIGNAL NAME | SIGNAL TRANSFERRED BETWEEN DIAGRAMS |
| UPPER LIMIT MONITOR OPERATOR | H ‾ N | OUTPUT DIGITAL VALUE 1 IN RESPONSE TO INPUT OF ANALOG VALUE EXCEEDING N AND OUTPUT DIGITAL VALUE 0 IN OTHER CASE |
| LOWER LIMIT MONITOR OPERATOR | L ‾ N | OUTPUT DIGITAL VALUE 1 IN RESPONSE TO INPUT OF ANALOG VALUE LESS THAN N AND OUTPUT DIGITAL VALUE 0 IN OTHER CASE |
| LOGICAL AND OPERATOR | AND | OUTPUT DIGITAL VALUE 1 IF ALL INPUTS ARE DIGITAL VALUES 1 AND OUTPUT DIGITAL VALUE 0 IN OTHER CASE |
| LOGICAL OR OPERATOR | OR | OUTPUT DIGITAL VALUE 0 IF ALL INPUTS ARE DIGITAL VALUES 0 AND OUTPUT DIGITAL VALUE 1 IN OTHER CASE |
| NOT OPERATOR | NOT | OUTPUT DIGITAL VALUE 1 IN RESPONSE TO INPUT OF DIGITAL VALUE 0 AND OUTPUT DIGITAL VALUE 0 IN RESPONSE TO INPUT OF DIGITAL VALUE 1 |
| SIGNAL LINE | | DESCRIPTION |
| ----------------▶ | | ANALOG LINE (TAKE ON REAL NUMBER VALUE) |
| ───────────▶ | | DIGITAL LINE (TAKE ON 0 OR 1) |

FIG. 4

| TEST No. | INPUT | | OUTPUT | | | | RESULT | COMMENT |
|---|---|---|---|---|---|---|---|---|
| | PRESSURIZER PRESSURE | PRESSURIZER ALARM INHIBITION | PRESSURIZER PRESSURE ABNORMALLY HIGH | PRESSURIZER PRESSURE HIGH | PRESSURIZER PRESSURE LOW | PRESSURIZER PRESSURE ABNORMALLY LOW | | |
| 1 | 110 | FALSE | TRUE | TRUE | FALSE | FALSE | | GENERATE ALARM ABOUT PRESSURE ABNORMALLY HIGH |
| 2 | 90 | FALSE | FALSE | TRUE | FALSE | FALSE | | GENERATE ALARM ABOUT PRESSURE HIGH |
| 3 | 50 | FALSE | FALSE | FALSE | FALSE | FALSE | | GENERATE NO ALARM |
| 4 | 20 | FALSE | FALSE | FALSE | TRUE | FALSE | | GENERATE ALARM ABOUT PRESSURE LOW |
| 5 | 5 | FALSE | FALSE | FALSE | TRUE | TRUE | | GENERATE ALARM ABOUT PRESSURE ABNORMALLY LOW |

401

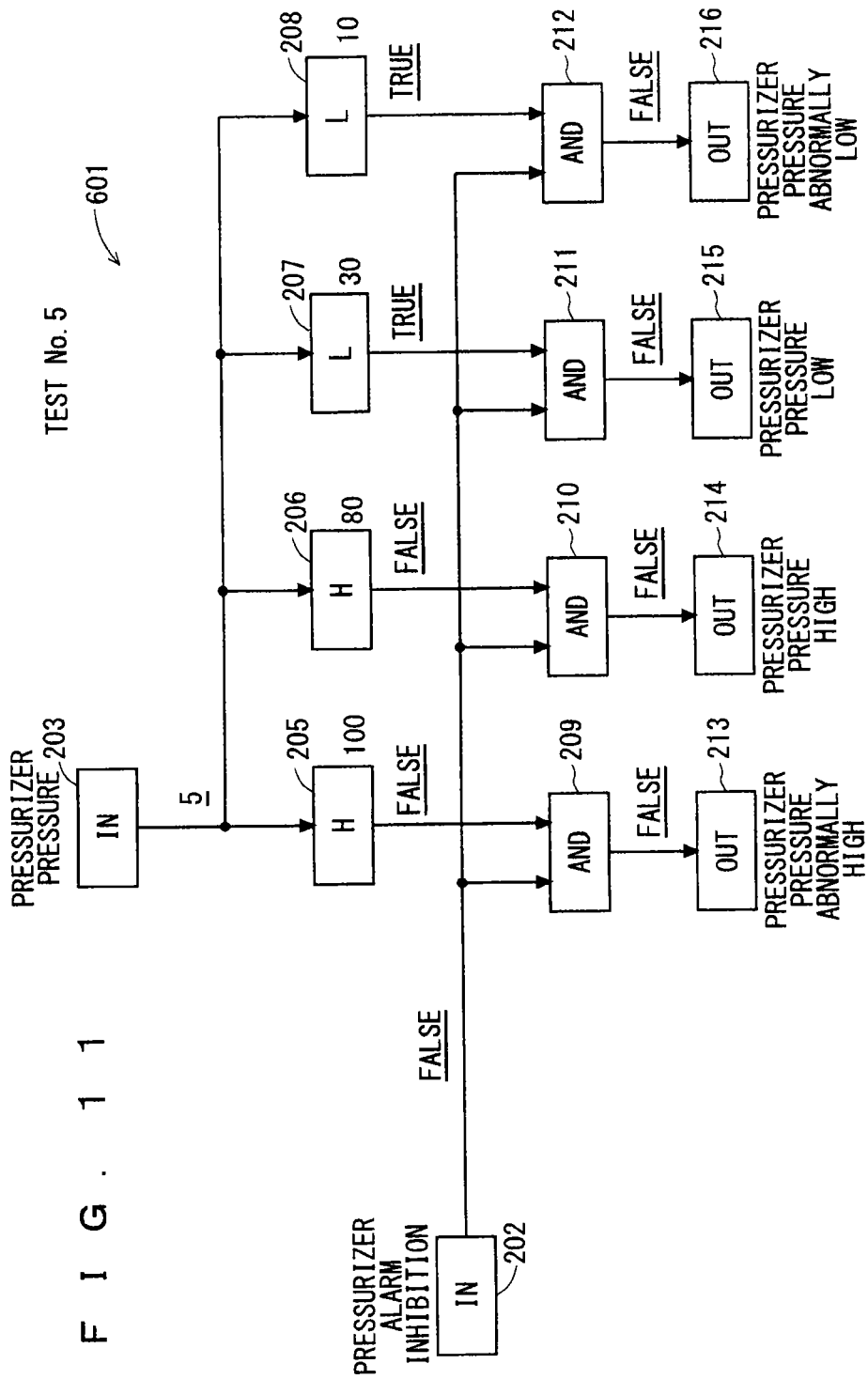

FIG. 12

| TEST No. | INPUT | | OUTPUT | | | | RESULT | COMMENT |
|---|---|---|---|---|---|---|---|---|
| | PRESSURIZER PRESSURE | PRESSURIZER ALARM INHIBITION | PRESSURIZER PRESSURE ABNORMALLY HIGH | PRESSURIZER PRESSURE HIGH | PRESSURIZER PRESSURE LOW | PRESSURIZER PRESSURE ABNORMALLY LOW | | |
| 1 | 110 | FALSE | FALSE | FALSE | FALSE | FALSE | NG | GENERATE ALARM ABOUT PRESSURE ABNORMALLY HIGH |
| 2 | 90 | FALSE | FALSE | FALSE | FALSE | FALSE | NG | GENERATE ALARM ABOUT PRESSURE HIGH |
| 3 | 50 | FALSE | FALSE | FALSE | FALSE | FALSE | OK | GENERATE NO ALARM |
| 4 | 20 | FALSE | FALSE | FALSE | FALSE | FALSE | NG | GENERATE ALARM ABOUT PRESSURE LOW |
| 5 | 5 | FALSE | FALSE | FALSE | FALSE | FALSE | NG | GENERATE ALARM ABOUT PRESSURE ABNORMALLY LOW |

| ARITHMETIC ELEMENT | TRACKING METHOD |
|---|---|
| LOGICAL AND OPERATOR | • WHERE SIGNAL LINE ON OUTPUT SIDE IS ERROR, OUTPUT VALUE IS TRUE (1): TRACK SIGNAL LINE OF INPUT VALUE TRUE (1) OUTPUT VALUE IS FALSE (0): TRACK SIGNAL LINE OF INPUT VALUE FALSE (0)<br>• WHERE SIGNAL LINE ON OUTPUT SIDE IS CORRECT, OUTPUT VALUE IS TRUE (1): TRACK SIGNAL LINE OF INPUT VALUE TRUE (1) OUTPUT VALUE IS FALSE (0): FINISH TRACKING |
| LOGICAL OR OPERATOR | • WHERE SIGNAL LINE ON OUTPUT SIDE IS ERROR, OUTPUT VALUE IS TRUE (1): TRACK SIGNAL LINE OF INPUT VALUE TRUE (1) OUTPUT VALUE IS FALSE (0): TRACK SIGNAL LINE OF INPUT VALUE FALSE (0)<br>• WHERE SIGNAL LINE ON OUTPUT SIDE IS CORRECT, OUTPUT VALUE IS TRUE (1): FINISH TRACKING OUTPUT VALUE IS FALSE (0): TRACK SIGNAL LINE OF INPUT VALUE FALSE (0) |
| OTHER OPERATOR | • WHERE SIGNAL LINE ON OUTPUT SIDE IS ERROR, TRACK ALL SIGNAL LINES<br>• WHERE SIGNAL LINE ON OUTPUT SIDE IS CORRECT, TRACK ALL SIGNAL LINES |

FIG. 22

TEST No. 2 ~2001

PRESSURIZER ALARM INHIBITION — IN 202 — FALSE → NOT 204 — TRUE

PRESSURIZER PRESSURE 203 — IN — 90 →

- H 205 (80) TRUE → AND 209 TRUE → OUT 213 PRESSURIZER PRESSURE ABNORMALLY HIGH
- H 206 (80) TRUE → AND 210 TRUE → OUT 214 PRESSURIZER PRESSURE HIGH
- L 207 (30) FALSE → AND 211 FALSE → OUT 215 PRESSURIZER PRESSURE LOW
- L 208 (10) FALSE → AND 212 FALSE → OUT 216 PRESSURIZER PRESSURE ABNORMALLY LOW

| TEST No. | INPUT | | | OUTPUT | | | | RESULT | COMMENT |
|---|---|---|---|---|---|---|---|---|---|
| | PRESSURIZER PRESSURE | PRESSURIZER ALARM INHIBITION | | PRESSURIZER PRESSURE ABNORMALLY HIGH | PRESSURIZER PRESSURE HIGH | PRESSURIZER PRESSURE LOW | PRESSURIZER PRESSURE ABNORMALLY LOW | | |
| 1 | 110 | FALSE | | TRUE | TRUE | FALSE | FALSE | OK | GENERATE ALARM ABOUT PRESSURE ABNORMALLY HIGH |
| 2 | 90 | FALSE | | TRUE | TRUE | FALSE | FALSE | NG | GENERATE ALARM ABOUT PRESSURE HIGH |
| 3 | 50 | FALSE | | FALSE | FALSE | FALSE | FALSE | OK | GENERATE NO ALARM |
| 4 | 20 | FALSE | | FALSE | FALSE | TRUE | FALSE | OK | GENERATE ALARM ABOUT PRESSURE LOW |
| 5 | 5 | FALSE | | FALSE | FALSE | TRUE | TRUE | OK | GENERATE ALARM ABOUT PRESSURE ABNORMALLY LOW |

F I G . 3 0

| TEST No. | INPUT | | | | | | | | | OUTPUT | RESULT |
|---|---|---|---|---|---|---|---|---|---|---|---|
| | DIGITAL INPUT 01 | DIGITAL INPUT 02 | DIGITAL INPUT 03 | DIGITAL INPUT 04 | DIGITAL INPUT 05 | DIGITAL INPUT 06 | ANALOG INPUT 01 | ANALOG INPUT 02 | ANALOG INPUT 03 | ALARM OUTPUT 01 | |
| 1 | FALSE | FALSE | FALSE | TRUE | TRUE | TRUE | 10 | 2 | 80 | FALSE | |
| 2 | TRUE | TRUE | TRUE | FALSE | FALSE | FALSE | 10 | 2 | 80 | FALSE | |
| 3 | TRUE | TRUE | TRUE | TRUE | TRUE | TRUE | 10 | 2 | 80 | TRUE | |
| 4 | TRUE | TRUE | TRUE | TRUE | TRUE | TRUE | 10 | 2 | 120 | FALSE | |

| TEST No. | INPUT | | | | | | | | | OUTPUT | RESULT |
|---|---|---|---|---|---|---|---|---|---|---|---|
| | DIGITAL INPUT 01 | DIGITAL INPUT 02 | DIGITAL INPUT 03 | DIGITAL INPUT 04 | DIGITAL INPUT 05 | DIGITAL INPUT 06 | ANALOG INPUT 01 | ANALOG INPUT 02 | ANALOG INPUT 03 | ALARM OUTPUT 01 | |
| 1 | FALSE | FALSE | FALSE | TRUE | TRUE | TRUE | 10 | 2 | 80 | FALSE | OK |
| 2 | TRUE | TRUE | TRUE | FALSE | FALSE | FALSE | 10 | 2 | 80 | FALSE | OK |
| 3 | TRUE | TRUE | TRUE | TRUE | TRUE | TRUE | 10 | 2 | 80 | FALSE | NG |
| 4 | TRUE | TRUE | TRUE | TRUE | TRUE | TRUE | 10 | 2 | 120 | FALSE | OK |

| ARITHMETIC ELEMENT | | | COMPLEXITY LEVEL |
|---|---|---|---|
| INPUT OPERATOR | IN | SIGNAL NAME | 1 |
| OUTPUT OPERATOR | OUT | SIGNAL NAME | 1 |
| JUMP OPERATOR | JUMP | SIGNAL NAME | 1 |
| UPPER LIMIT MONITOR OPERATOR | H | N | 4 |
| LOWER LIMIT MONITOR OPERATOR | L | N | 4 |
| LOGICAL AND OPERATOR | AND | | 2 |
| LOGICAL OR OPERATOR | OR | | 2 |
| NOT OPERATOR | NOT | | 2 |
| OTHER ARITHMETIC OPERATOR | | | 2 |

DEVICE FOR AND METHOD OF ESTIMATING ERROR POINT IN LOGIC DIAGRAM

TECHNICAL FIELD

The present invention relates to a device for estimating an error point in a logic diagram and a method of estimating an error point in a logic diagram, that estimate an error point in a logic diagram representing the substance of control for example of a unit in a supervisory control system.

BACKGROUND ART

A supervisory control system is such a system that provides an operator/observer with information given from units to be monitored such as sensors of various types including a temperature sensor, a pressure sensor, and a position sensor. The supervisory control system also controls units of various types including a motor, a valve, a switch, and an oil hydraulic unit in response to an operation by the operator/observer. The supervisory control system is used in a wide range of fields including power-generating plants, chemical plants, power receiving and distributing facilities, and water supply and sewerage systems.

A typical supervisory control system includes a plurality of modules responsible for respective processes such as transmission and receipt of signals to and from a unit targeted for supervisory control. These modules are coupled through a communication path to perform various processes (various modes).

In many cases, the substance of a process performed in each module of a supervisory control system is represented by an oriented graph such as a circuit diagram in which directions of input and output of signals are indicated by arrows. More specifically, the substance of a process performed in each module is expressed by a combination of nodes representing signal processes (hereinafter also called as "arithmetic elements"), and a link connecting the nodes and showing a flow of the signals (hereinafter also called a "signal line"). The substance of a process in a module was formerly realized fixedly in a hardware circuit. In recent years, in consideration of flexibility and cost performance, it has been implemented as a program relating to a digital calculator in many cases, so that the digital calculator can simulate the operation of the process before the process is performed.

Standards for a programming language that expresses the substance of a process with arithmetic elements and a signal line include the international standard IEC 61131-3, for example. The arithmetic elements are described in an FBD (function block diagram) conforming to the international standard IEC 61131-3, and the substance of the process expressed by a combination of the arithmetic elements and the signal line is described in a diagram called a logic diagram.

A trend of recent times toward a larger scale of a program has made debugging (finding and removing errors) a difficult task. This phenomenon also applies to generation of a logic diagram (control logic diagram) representing a control logic of supervisory control in a supervisory control system. More specifically, the logic diagram describes various processes (behaviors) corresponding to various modes, so that the control logic may tend to be complicated. The complicated control logic is described separately in a plurality of logic diagrams. Additionally, as a result of a large number of units to be controlled, a huge number of logic diagrams to control these units should be prepared.

Conventionally, if NG (no good) is detected in a test of a control logic, a designer searches for a logic diagram manually to be invested, then tracks the control logic based on a signal output determined to be an error, and specifies an error point as a cause for the NG on the test. If NG is detected in a complicated control logic described over a plurality of diagrams, specifying an error point has taken a long time accordingly.

Patent literature 1 describes a technique of estimating an error point as a conventional example. In this technique, a fault is assumed first inside a circuit by using a fault simulator, and then a functional or logic simulation is performed. A result of the simulation and an expected value are compared, a fault dictionary is generated in which the assumed point of the fault and a test vector having detected the fault are associated, and fail information is acquired from a result of an actual test of the circuit. Next, the fault dictionary is searched by each of a fail pin and a fail vector about the fail information to acquire the assumed point of the fault. A fault point is estimated by determining the priorities of a plurality of resultant fault points.

In a technique described in patent literature 2, logical consistency determining means detects an inconsistency in a logical status of each signal line during implication operation by first implication operation means. If no inconsistency is detected, process termination determining means determines whether logical statuses of all signal lines have been estimated to be "0," "1," or "X." If it is determined that the estimation of a logical status has not been finished, U (unknown) status searching means searches for a signal line in an unknown status meaning an incomplete logical status, and detects a signal line connected through a gate to a fault propagation path including the signal line. The detected signal line is provisionally determined to be "0" and a provisional determination level indicating the number of times provisional determination is made is increased by 1. Then, the first implication operation means performs the implication operation again. If it is determined that the estimation of a logical status has been finished, fault output terminal connection line extracting means extracts a fault propagation path that might affect a fault output terminal directly and outputs the extracted path to an output unit.

PRIOR ART LITERATURES

Patent Literatures

Patent Literature 1: Japanese Patent No. 3863423
Patent Literature 2: Japanese Patent No. 3137056

SUMMARY OF INVENTION

Problems to be Solved by Invention

Patent literature 1 describes that a fault dictionary should be generated in advance. Generating the fault dictionary involves a considerably large number of fault simulations. This causes the problems of an enormous amount of calculation time, and a considerably large number of files and a considerably large data volume of the fault dictionary.

Patent literature 2 describes that the logical statuses of all signal lines are estimated by repeating implication operation and provisional determination. This causes a problem in that a database should be prepared in advance that is to be used for implication operation in the directions of an input and an output, process of searching for a provisional determination signal line, and process of transmitting fault terminal information. Additionally, increase in a scale of a circuit targeted for fault detection increases the number of times provisional determination is made. This further causes a problem in that acquiring the logical statuses of all inputs by repeating the implication operation and the provisional determination involves an enormous amount of calculation time.

The present invention has been made to solve the aforementioned problems. It is an object of the present invention to provide a technique capable of estimating an error point in a logic diagram appropriately.

Means of Solving Problems

A device for estimating an error point in a logic diagram of the present invention estimates an error point in a logic diagram including arithmetic elements that perform arithmetic operation and a signal line connecting the arithmetic elements. The device for estimating an error point in a logic diagram includes: a logic diagram storage that stores the logic diagram; and a test table storage that stores a test table as a correspondence table of an input value and an output value to each test, for determining whether the logic diagram is correct or incorrect. The device for estimating an error point in a logic diagram further includes: a signal line correctness/incorrectness determining unit that determines for said each test whether each signal line in the logic diagram is correct or incorrect based on a signal line status value of each signal line and the test table, the signal line status value being acquired for each test by conducting each test in the test table on the logic diagram; and a signal line correctness/incorrectness result summarizing unit that calculates a correctness/incorrectness result summarized value of each signal line based on a result of determination about the correctness or incorrectness of each signal line given by the signal line correctness/incorrectness determining unit. The device for estimating an error point in a logic diagram further includes: an error signal line estimating unit that estimates an error in each signal line based on the correctness/incorrectness result summarized value of each signal line calculated by the signal line correctness/incorrectness result summarizing unit; and a display that displays each signal line in the logic diagram in a display style responsive to the error in each signal line estimated by the error signal line estimating unit.

Advantageous Effects of Invention

According to the present invention, the signal line correctness/incorrectness determining unit determines for each test whether each signal line in the logic diagram is correct or incorrect based on the signal line status value, the signal line correctness/incorrectness result summarizing unit calculates a correctness/incorrectness result summarized value of each signal line based on a result of determination about the correctness or incorrectness of each signal line, the error signal line estimating unit estimates an error in each signal line in the logic diagram based on the correctness/incorrectness result summarized value of each signal line, and the display displays the signal line in the logic diagram in a display style responsive to the error in each signal line. As a result, preparation such as generation of a fault dictionary becomes unnecessary while an error point in the logic diagram can be estimated in a short calculation time.

BRIEF DESCRIPTION OF DRAWINGS

FIG. 1 is a block diagram showing the structure of a logic diagram display device of a first embodiment.

FIG. 2 shows an example of a logic diagram.

FIG. 3 shows arithmetic elements, rules of describing signals, and descriptions.

FIG. 4 shows an example of a test table.

FIG. 11 shows signal line status values (test No. 5) in the logic diagram.

FIG. 12 is an example of a test result table.

FIG. 13 shows exemplary tracking rules.

FIG. 22 shows signal line status values in the logic diagram and a result indicating whether each signal line in the logic diagram is correct or incorrect (test No. 2).

FIG. 26 shows an example of a test result table.

FIG. 30 shows an example of a test table.

FIG. 34 shows an example of a test result table.

FIG. 36 shows the complexity levels of arithmetic elements.

DESCRIPTION OF EMBODIMENT

First Embodiment

Figure 5:
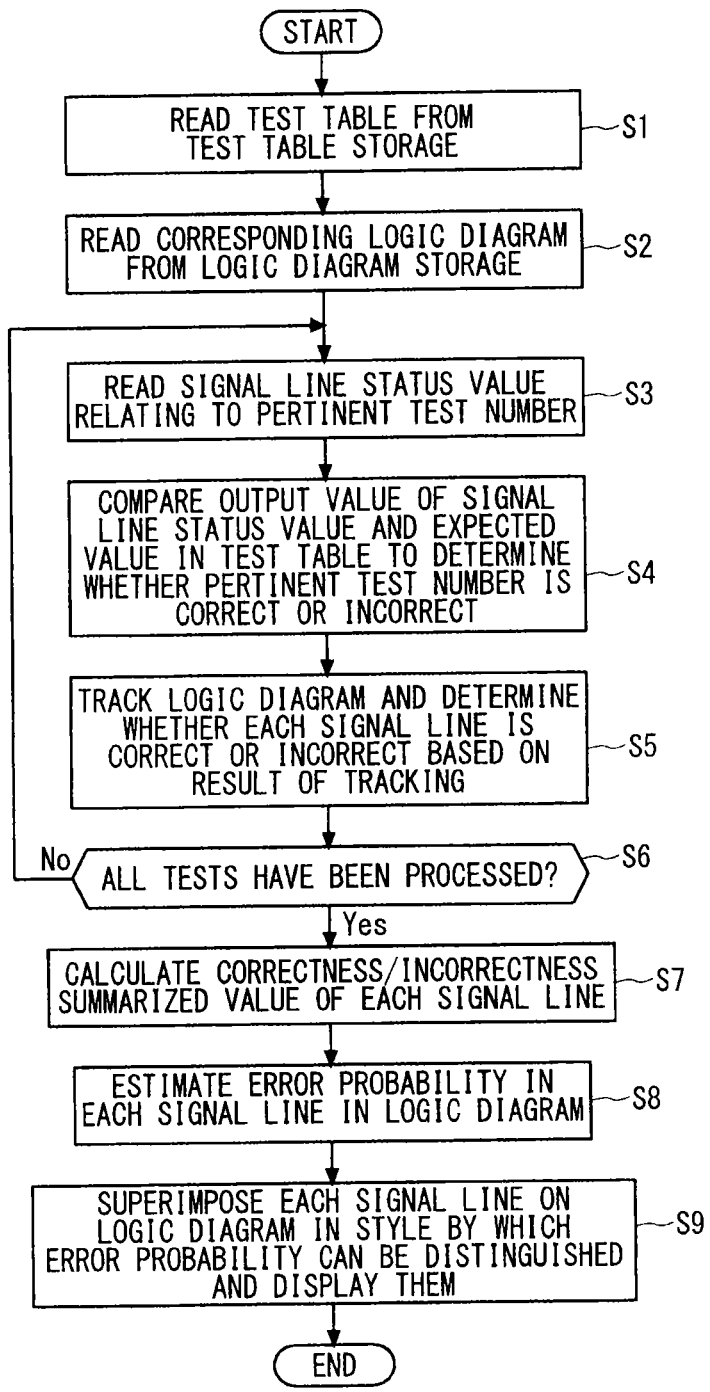
FIG. 5 is a flowchart showing the operation of the logic diagram display device of the first embodiment.

FIG. 1 is a block diagram showing the structure of a logic diagram display device of a first embodiment of the present invention. The logic diagram display device of the first embodiment shown in FIG. 1 has the function of a device for estimating an error point in a logic diagram that estimates an error point in a logic diagram. The logic diagram display device is formed of the following elements (including a logic diagram storage 101 to a display 109).

The logic diagram storage 101 is formed of a memory and stores a logic diagram. The logic diagram represents a control logic used for supervisory control of a unit. The logic diagram includes arithmetic elements that perform various arithmetic operations on a signal and a signal line connecting the arithmetic elements and showing a flow of a signal.

A test table storage 102 is formed of a memory and stores a test table. The test table is a correspondence table of an input value and a desired output value (expected value) collected for each test, for determining whether a logic diagram is correct or incorrect (for ensuring the correctness of the logic diagram). In each test in the test table, whether a logic diagram is correct or incorrect is determined based on whether an output of a control logic in the logic diagram resulting from an entry of an input value to this control logic is the same as an output value (expected value).

A signal line status value storage 103 is formed of a memory and stores a signal line status value. The signal line status value is a status value of each signal line in a logic diagram, acquired for each test in a test table by conducting the test on this logic diagram in advance. The signal line status value may be stored in advance in the signal line status value storage 103 in response to an input from a user. Meanwhile, in this embodiment, the signal line status value is acquired by a signal line status value acquiring unit 104 and is stored in advance in the signal line status value storage 103.

The signal line status value acquiring unit 104 reads a signal line status value from the signal line status value storage 103 where appropriate, and provides the read signal line status value to a signal line correctness/incorrectness determining unit 105.

The signal line correctness/incorrectness determining unit 105 determines for each test in a test table whether each signal line in a logic diagram read from the logic diagram storage 101 is correct or incorrect based on a signal line status value of each signal line provided from the signal line status value acquiring unit 104 and the test table read from the test table storage 102.

A signal line tracking unit 106 tracks a signal line in a logic diagram read by the signal line correctness/incorrectness determining unit 105. As described later, a result of the tracking by the signal line tracking unit 106 is used by the signal line correctness/incorrectness determining unit 105 to determine whether each signal line is correct or incorrect.

A signal line correctness/incorrectness result summarizing unit 107 calculates a correctness/incorrectness result summarized value of each signal line in a logic diagram based on a result of determination about the correctness or incorrectness of each signal line (hereinafter also called a "signal line correctness/incorrectness determination result" in some cases) given by the signal line correctness/incorrectness determining unit 105. The signal line correctness/incorrectness result summarizing unit 107 mentioned herein summarizes signal line correctness/incorrectness determination results of each signal line relating to a plurality of tests (here, all tests) given by the signal line correctness/incorrectness determining unit 105, thereby calculating the correctness/incorrectness result summarized value of each signal line.

An error signal line estimating unit 108 estimates an error in each signal line in a logic diagram based on a correctness/incorrectness result summarized value of each signal line calculated by the signal line correctness/incorrectness result summarizing unit 107. An error in each signal line to be estimated by the error signal line estimating unit 108 includes the presence or absence of an error in each signal line and the probability of each signal line being erroneous, for example. In this embodiment, an error in each signal line to be estimated means the probability of each signal line being erroneous (hereinafter called an "error probability in each signal line").

The display 109 displays each signal line in a logic diagram in a display style responsive to an error probability in each signal line estimated by the error signal line estimating unit 108. The display 109 mentioned herein displays each signal line such that each signal line is superimposed on a logic diagram in a display style by which an error probability estimated by the error signal line estimating unit 108 can be distinguished.

FIG. 2 shows an example of a logic diagram stored in the logic diagram storage 101. FIG. 3 shows arithmetic elements in the logic diagram, rules of describing signal lines, and descriptions. FIG. 3 shows only some types of arithmetic elements and signal lines. The logic diagram includes various arithmetic elements as well as the arithmetic elements and the signal lines of FIG. 3.

A logic diagram 201 shown in FIG. 2 includes a plurality of arithmetic elements (input operator, NOT operator, upper limit monitor operator, lower limit monitor operator, logical AND operator, and output operator), and signal lines (analog lines indicated by dashed lines and digital lines indicated by solid lines) connecting these arithmetic elements.

A pressurizer alarm inhibit signal input 202 is an input operator to receive a digital pressurizer alarm inhibit signal (signal indicating "FALSE (0)" or "TRUE (1)" as a digital value) as one type of a signal about alarm inhibition. A pressurizer pressure signal input 203 is an input operator to receive an analog pressurizer pressure signal. A NOT operator 204 shown in FIG. 2 receives a digital signal from the pressurizer alarm inhibit signal input 202. The NOT operator 204 inverts the digital signal from the pressurizer alarm inhibit signal input 202.

An upper limit monitor operator 205, an upper limit monitor operator 206, a lower limit monitor operator 207, and a lower limit monitor operator 208 shown in FIG. 2 each receive a signal from the pressurizer pressure signal input 203. The upper limit monitor operator 205 outputs a digital value "TRUE (1)" in response to an input of an analog value exceeding "100" and outputs a digital value "FALSE (0)" in the other cases. The upper limit monitor operator 206 outputs a digital value "TRUE (1)" in response to an input of an analog value exceeding "80" and outputs a digital value "FALSE (0)" in the other cases. The lower limit monitor operator 207 outputs a digital value "TRUE (1)" in response to an input of an analog value less than "30" and outputs a digital value "FALSE (0)" in the other cases. The lower limit monitor operator 208 outputs a digital value "TRUE (1)" in response to an input of an analog value less than "10" and outputs a digital value "FALSE (0)" in the other cases.

Logical AND operators 209 to 212 shown in FIG. 2 receive outputs of the upper limit monitor operators 205 and 206 and the lower limit monitor operators 207 and 208 respectively. Further, logical AND operators 209 to 212 each receive an output of the NOT operator 204. The logical AND operators 209 to 212 each output a digital value "TRUE (1)" if all inputs to each of the logical AND operators 209 to 212 are digital values "TRUE (1)," and output a digital value "FALSE (0)" in the other cases. As an example, the logical AND operator 209 outputs a digital value "TRUE (1)" if both the upper limit monitor operator 205 and the NOT operator 204 output digital values "TRUE (1)" to the logical AND operator 209, and outputs a digital value "FALSE (0)" in the other cases.

Outputs of the logical AND operators 209 to 212 are set as a pressurizer pressure abnormally high signal output 213, a pressurizer pressure high signal output 214, a pressurizer pressure low signal output 215, and a pressurizer pressure abnormally low signal output 216 respectively that function as output operators.

FIG. 4 shows an example of a test table of this embodiment stored in the test table storage 102. A test table 401 shown in FIG. 4 includes a combination of input values and desired output values (expected values) in a table format relating to each of tests Nos. 1 to 5. More specifically, the test table 401 includes respective input values of pressurizer pressure and pressurizer alarm inhibition, and respective desired output values of pressurizer pressure abnormally high, pressurizer pressure high, pressurizer pressure low, and pressurizer pressure abnormally low that are described in a table format.

As an example, the test No. 1 in the test table 401 of FIG. 4 shows that in response to an input of an analog value "110" to the pressurizer pressure signal input 203 and an input of a digital value "FALSE (0)" to the pressurizer alarm inhibit signal input 202 in a logic diagram, a desired digital value from the pressurizer pressure abnormally high signal output 213 is "TRUE (1)," a desired digital value from the pressurizer pressure high signal output 214 is "TRUE (1)," a desired digital value from the pressurizer pressure low signal output 215 is "FALSE (0)," and a desired digital value from the pressurizer pressure abnormally low signal output 216 is "FALSE (0)" in the same logic diagram.

The logic diagram 201 shown in FIG. 2 is to give output values same as corresponding output values relating to each test in the test table 401 in response to entry of input values relating to each test in the test table 401. Thus, the logic diagram 201 is determined to be correct according to the test table 401.

<Operation>

FIG. 5 is a flowchart showing the operation of estimating an error signal line in a logic diagram and displaying the estimated error signal line in the logic diagram by the logic diagram display device of this embodiment. The following describes the details of operation by the logic diagram display device of this embodiment, including estimating an error point by using the test table 401 by which the logic diagram 201 is determined to be correct.

<First Exemplary Operation>

Figure 6:
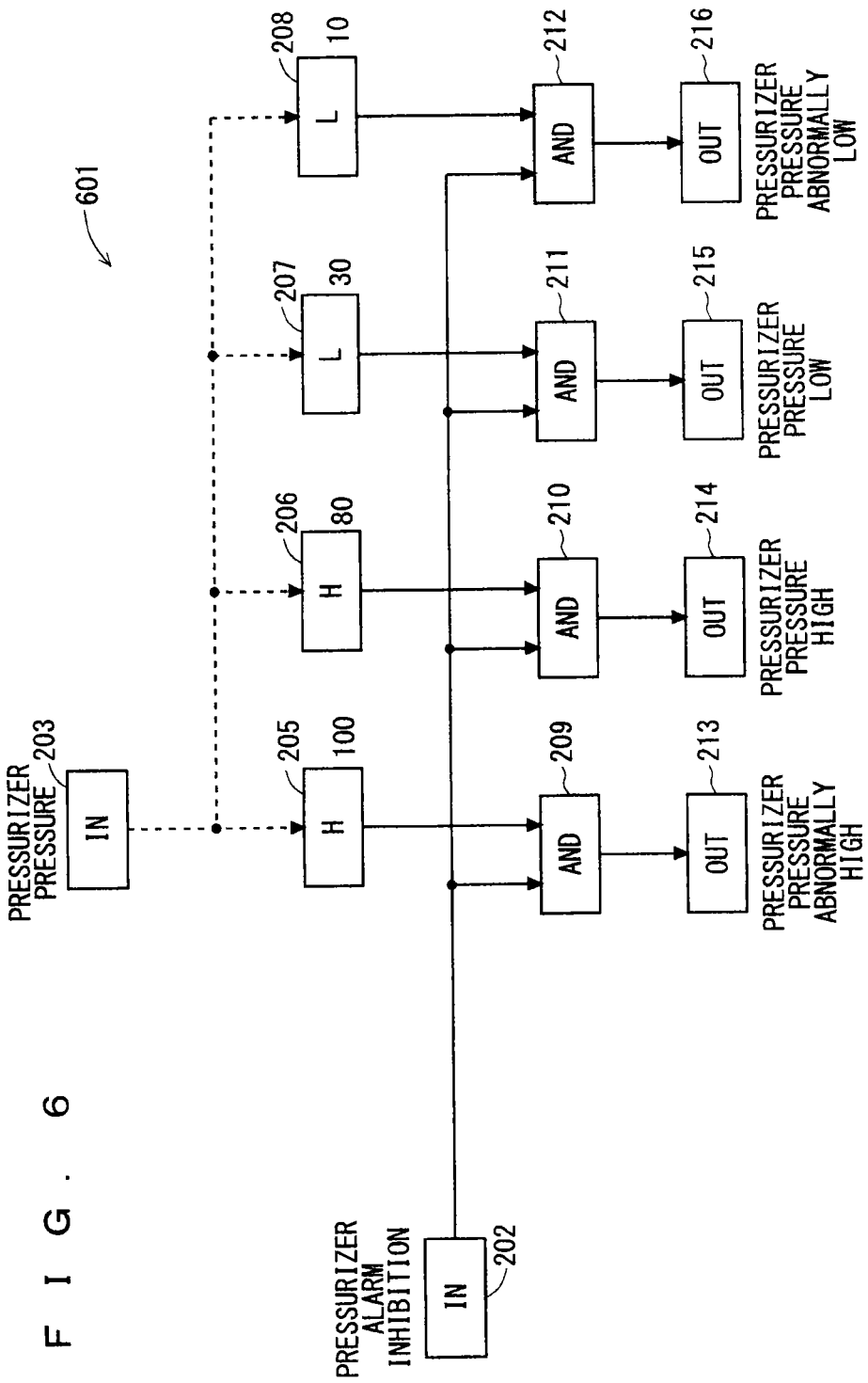
FIG. 6 shows an example of a logic diagram.

First exemplary operation is intended for the operation of the logic diagram display device of this embodiment on a logic diagram 601 shown in FIG. 6. In comparison with the logic diagram 201 of FIG. 2, the logic diagram 601 includes an error in that the NOT operator 204 is missing. As described below, the operation by the logic diagram display device of this embodiment shown in FIG. 5 allows a user to find an error point (missing of the NOT operator 204) in the logic diagram 601 easily.

In this embodiment, before step S1 is performed, the logic diagram 601 is stored in the logic diagram storage 101 and a signal line status value in the logic diagram 601 is stored in the signal line status value storage 103. Before description of the operation in step S1 and in its subsequent steps is started, the operation of storing a signal line status value in the logic diagram 601 is described.

First, the signal line status value acquiring unit 104 conducts each test in the test table 401 on the logic diagram 601. Specifically, the signal line status value acquiring unit 104 enters input values of each test into the logic diagram 601 and performs arithmetic operation based on a control logic of the logic diagram 601. As a result, the signal line status value acquiring unit 104 acquires a status value of each signal line (result of the arithmetic operation), specifically a signal line status value in the logic diagram 601.

Figure 7:
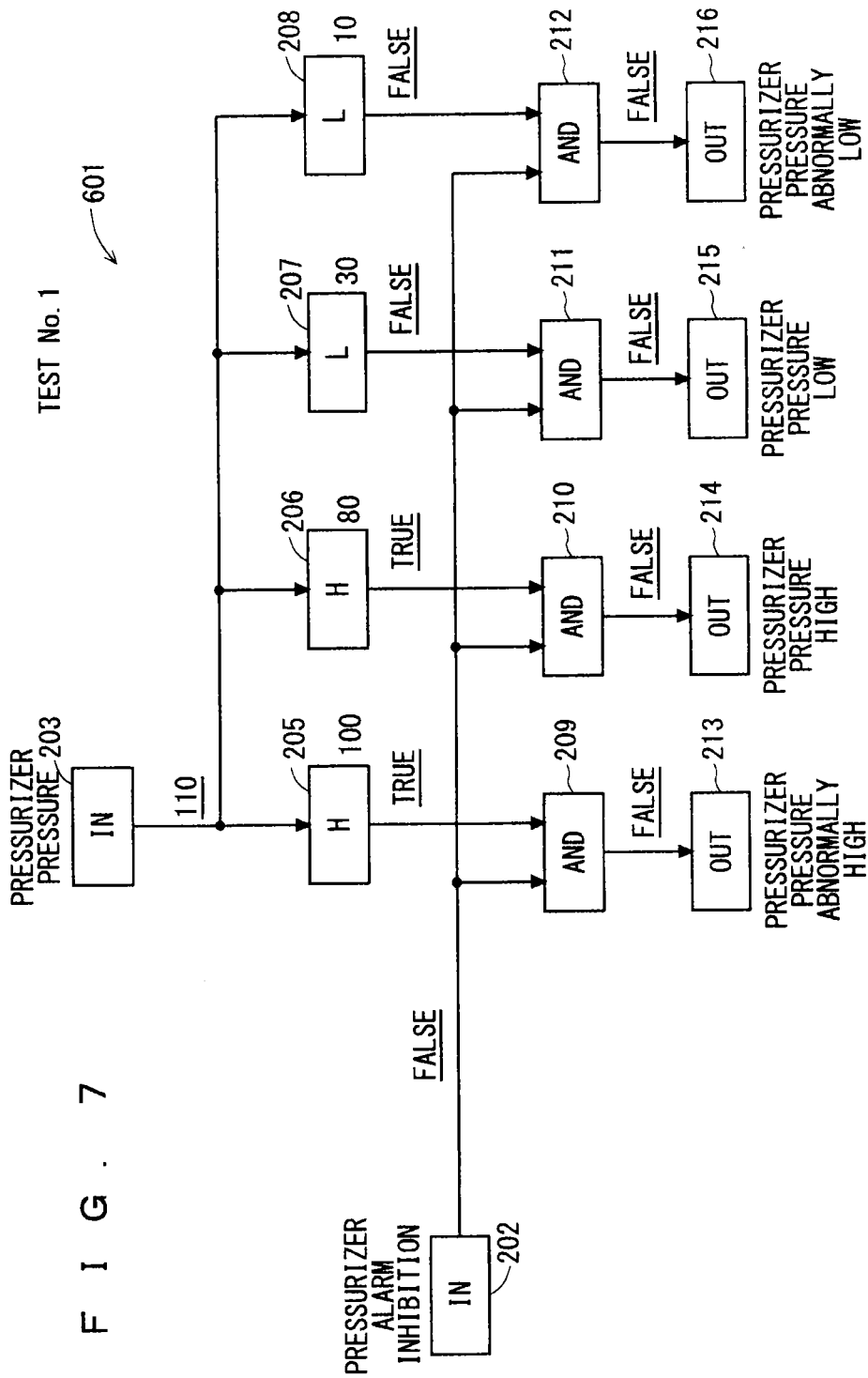
FIG. 7 shows signal line status values (test No. 1) in the logic diagram.
Figure 8:
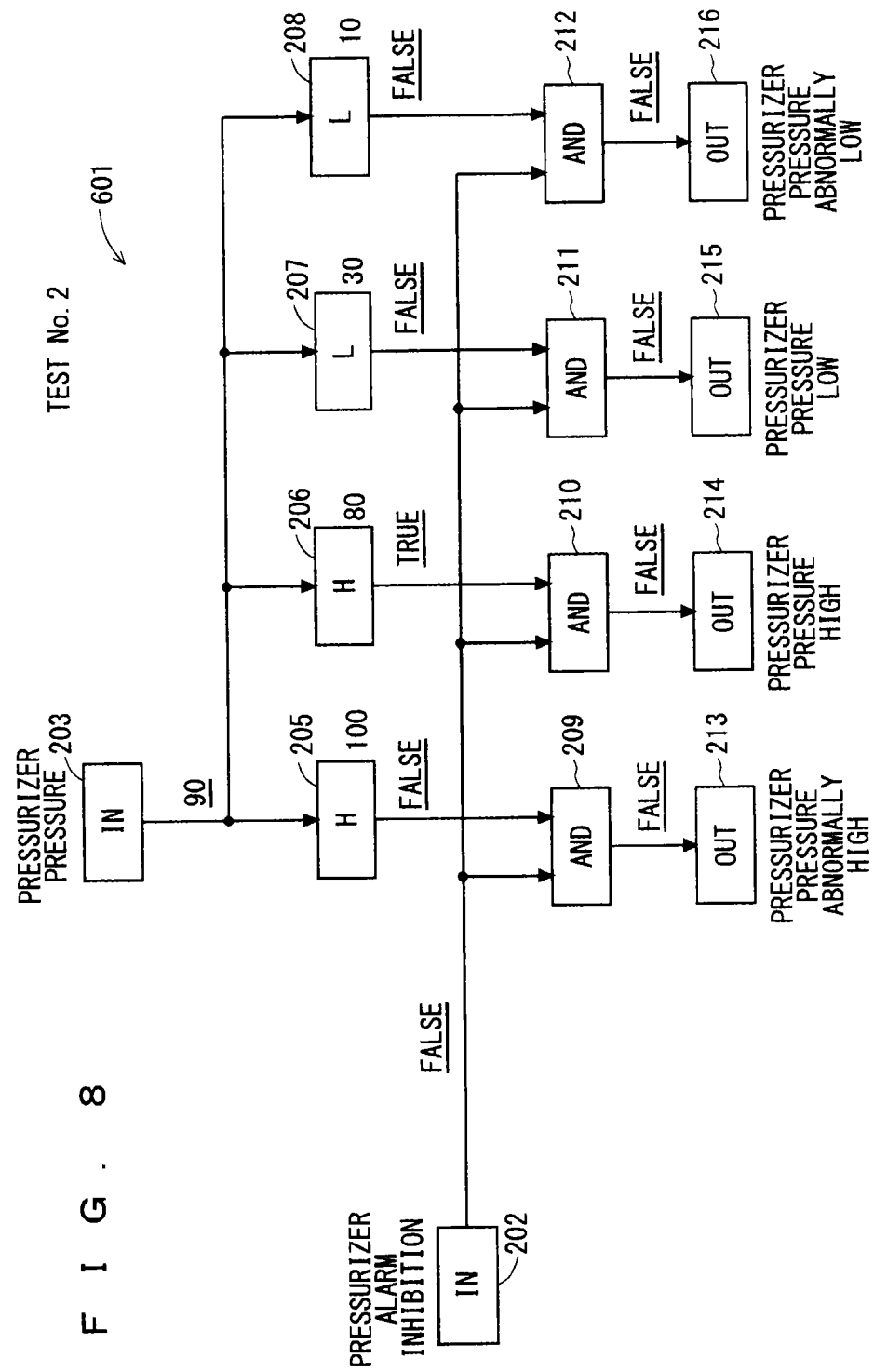
FIG. 8 shows signal line status values (test No. 2) in the logic diagram.

The logic diagram 601 shown in FIG. 7 additionally includes signal line status values shown as underlined values (TRUE or FALSE) acquired by conducting the test No. 1 in the test table 401 on the logic diagram 601. For the sake of convenience, the logic diagram 601 of FIG. 7 does not show the signal types of signal lines (analog lines or digital lines) distinctively (by dashed lines or solid lines). In subsequent drawings showing logic diagrams used to describe the operation of the logic diagram display device, distinctive indication of signal lines according to their signal types is omitted, where appropriate.

The acquisition of the signal line status values (FIG. 7) for the test No. 1 added to the logic diagram 601 is described in detail next. According to the test No. 1, an analog value "110" is input from the pressurizer pressure signal input 203 to the upper limit monitor operators 205 and 206 and the lower limit monitor operators 207 and 208. In response, the upper limit monitor operators 205 and 206 each output a digital value "TRUE (1)" whereas the lower limit monitor operators 207 and 208 each output a digital value "FALSE (0)."

The logical AND operators 209 to 212 respectively receive outputs of the upper limit monitor operators 205 and 206 ("TRUE (1)") and the lower limit monitor operators 207 and 208 ("FALSE (0)"). Further, the logical AND operators 209 to 212 each receive a digital value "FALSE (0)" as an output of the pressurizer alarm inhibit signal input 202. Thus, the logical AND operators 209 to 212 each output a digital value "FALSE (0)." As a result, the digital value "FALSE (0)" is set as each of the pressurizer pressure abnormally high signal output 213, the pressurizer pressure high signal output 214, the pressurizer pressure low signal output 215, and the pressurizer pressure abnormally low signal output 216.

As described above, the signal line status value acquiring unit 104 conducts the test No. 1 in the test table 401 (makes entry and calculation) on the logic diagram 601, thereby acquiring the signal line status values in the logic diagram 601 for the test No. 1. The signal line status value acquiring unit 104 conducts the tests Nos. 2 to 5 on the logic diagram 601 in the same way as that of conducting the test No. 1, thereby acquiring signal line status values in the logic diagram 601 for the tests Nos. 2 to 5. FIGS. 8 to 11 show a signal line status value of each signal line relating to the tests Nos. 2 to 5 respectively shown in the same format as in FIG.

7. The signal line status value acquiring unit 104 stores the acquired signal line status values into the signal line status value storage 103.

Referring back to FIG. 5, the operation of the logic diagram display device of this embodiment in step S1 and in its subsequent steps is described next. First, in step S1, the signal line correctness/incorrectness determining unit 105 reads a designated test table (here, the test table 401) from the test table storage 102.

Next, in step S2, the signal line correctness/incorrectness determining unit 105 reads a logic diagram (here, the logic diagram 601) from the logic diagram storage 101 corresponding to the read test table (here, the test table 401).

Steps S3 to S6 correspond to processes to be performed relating to each of tests in the test table read in step S1 and are repeated a number of times corresponding to the number of these tests. In the example described next, steps S3 to S6 are performed relating to the test No. 1 in the test table 401 (FIG. 4).

In step S3, the signal line status value acquiring unit 104 reads a signal line status value (here, the signal value status values shown in FIG. 7) corresponding to a pertinent test (here, the test No. 1) in the test table 401, and provides the read signal line status value to the signal line correctness/ incorrectness determining unit 105.

In step S4, the signal line correctness/incorrectness determining unit 105 compares an output value of the signal line status value (here, the signal line status values shown in FIG. 7) given from the signal line status value acquiring unit 104 and an output value (expected value) in the test table (here, the test table 401) read in step S1 with each other to determine whether the pertinent test (here, the test No. 1) is correct or incorrect.

FIG. 12 shows a test result table 1201 in which output values of signal line status values in the logic diagram 601 are collected relating to each test, specifically, results obtained by conducting the aforementioned tests Nos. 1 to 5 on the logic diagram 601 are collected. The test result table 1201 includes respective input values of pressurizer pressure and pressurizer alarm inhibition same as those in the test table 401, and respective output values of signal line status values on pressurizer pressure abnormally high, pressurizer pressure high, pressurizer pressure low, and pressurizer pressure abnormally low shown in FIGS. 7 to 11, specifically output values actually obtained by conducting the tests Nos. 1 to 5.

The test result table 1201 includes output values of signal line status values with underlines that differ from corresponding desired output values (expected values) in the test table 401 of FIG. 4. If output values of signal line status values agree with corresponding desired output values in the test table 401, "OK" indicating success is described in a result column relating to all the tests. If these output values do not agree with the corresponding desired output values, "NG" indicating failure is described in the result column relating to all the tests.

As an example, output values of signal line status values on the pressurizer pressure abnormally high signal output 213, the pressurizer pressure high signal output 214, the pressurizer pressure low signal output 215, and the pressurizer pressure abnormally low signal output 216 shown in the test result table 1201 relating to the test No. 1 are all "FALSE (0)." Meanwhile, relating to the test No. 1 shown in the test table 401, respective desired output values (expected values) of the pressurizer pressure abnormally high signal output 213 and the pressurizer pressure high signal output 214 are "TRUE (1)," and respective desired output values (expected values) of the pressurizer pressure low signal output 215 and the pressurizer pressure abnormally low signal output 216 are "FALSE (0)."

An output value of a signal line status value differs from an expected value relating to the pressurizer pressure abnormally high signal output 213 and the pressurizer pressure high signal output 214 of the test No. 1. Thus, the signal line correctness/incorrectness determining unit 105 determines the test No. 1 to be "NG." As a result, "NG" is described in the result column relating to the test No. 1 in the test result table 1201 (FIG. 12). Steps S3 to S6 are performed on each of the tests in the test table 401, so that the aforementioned determination relating to the test No. 1 is also made eventually relating to the tests Nos. 2 to 5. The test result table 1201 also includes respective results of determinations relating to the tests Nos. 2 to 5 (NG, OK, NG and NG respectively).

In step S5, the signal line tracking unit 106 tracks signal lines from an output side toward an input side of a logic diagram relating to the pertinent test based on a signal line status value of each signal line, an output value in a test table, and a tracking rule determined for each type of an arithmetic element in the logic diagram. Then, in step S5, the signal line correctness/incorrectness determining unit 105 determines for the pertinent test whether each signal line in the logic diagram is correct or incorrect based on a result of the tracking by the signal line tracking unit 106.

The signal line tracking unit 106 mentioned herein tracks signal lines from an output side toward an input side of the logic diagram 601 relating to the test No. 1 based on the output values of signal line status values shown in FIG. 7, the output values in the test table 401, and the tracking rule determined for each type of an arithmetic element in the logic diagram. Then, in step S5, the signal line correctness/ incorrectness determining unit 105 determines whether each signal line in the logic diagram 601 is correct or incorrect based on a result of the tracking by the signal line tracking unit 106.

FIG. 13 shows exemplary tracking rules to be used by the signal line tracking unit 106 of this embodiment to track a signal line. As shown in FIG. 13, the tracking rules of this embodiment define a method of tracking responsive to the type of an arithmetic element in a logic diagram and additionally, define a method of tracking responsive to a result of the determination relating to the test given in step S4 (result indicating whether output values of signal line status values all agree with corresponding output values in a test table).

If the result of the determination given in step S4 is OK, specifically if output values of signal line status values all agree with corresponding output values in a test table, the signal line tracking unit 106 starts tracking signal lines with these signal lines in agreement based on a tracking rule for tracking of a correct signal line from among tracking rules of FIG. 13. If the result of the determination given in step S4 is NG (if some of output values of signal line status values does not agree with a corresponding output value in a test table), the signal line tracking unit 106 starts tracking signal lines with this signal line not in agreement based on a tracking rule for tracking of an error signal line from among tracking rules of FIG. 13.

The following describes a specific example of the operation of tracking signal lines from an output side toward an input side of the logic diagram 601 relating to the test No. 1 by the signal line tracking unit 106.

As a result of the test No. 1, not all the output values of signal line status values (FIG. 7) agree with corresponding output values in the test table 401 so that the test No. 1 is determined to be NG (FIG. 12). Thus, the signal line tracking unit 106 selects the tracking rule about an error signal line from among the tracking rules of FIG. 13. Based on the selected tracking rule about an error signal line, the signal line tracking unit 106 tracks signal lines from a signal line on an output side not in agreement with a corresponding output value in the test table 401 (here, signal lines of the pressurizer pressure abnormally high signal output 213 and the pressurizer pressure high signal output 214) toward a signal line on an input side.

The logical AND operators 209 and 210 are described immediately before the pressurizer pressure abnormally high signal output 213 and the pressurizer pressure high signal output 214 respectively. Thus, the signal line tracking unit 106 selects a tracking rule about a logical AND operator from among the tracking rule about an error signal line. The tracking rule about a logical AND operator mentioned herein is a tracking rule shown in FIG. 13 that defines that "a signal line of an input value TRUE (1) is to be tracked if an output value is TRUE (1) and a signal line of an input value FALSE (0) is to be tracked if the output value is FALSE (0)." Then, based on the selected tracking rule, the signal line tracking unit 106 tracks signal lines from the respective signal lines of the pressurizer pressure abnormally high signal output 213 and the pressurizer pressure high signal output 214.

More specifically, regarding the signal line status values in the logic diagram 601 relating to the test No. 1 (FIG. 7), a status value of a signal line input to the pressurizer pressure abnormally high signal output 213 is "FALSE (0)." Thus, the signal line tracking unit 106 tracks a signal line of an input value "FALSE (0)" from among signal lines giving inputs to the logical AND operator 209. By repeating tracking in this way, the signal line tracking unit 106 gets to the pressurizer alarm inhibit signal input 202. Then, the signal line tracking unit 106 finishes tracking signal lines. The signal line tracking unit 106 tracks a series of signal lines from the pressurizer pressure high signal output 214 to the pressurizer alarm inhibit signal input 202 in the same way.

Then, the signal line correctness/incorrectness determining unit 105 determines all the signal lines to be "error signal lines" having been tracked by the signal line tracking unit 106 based on the tracking rule about an error signal line. In the aforementioned example, the signal line correctness/incorrectness determining unit 105 determines that a series of signal lines from the pressurizer pressure abnormally high signal output 213 to the pressurizer alarm inhibit signal input 202 and a series of signal lines from the pressurizer pressure high signal output 214 to the pressurizer alarm inhibit signal input 202 are "error signal lines."

Figure 14:
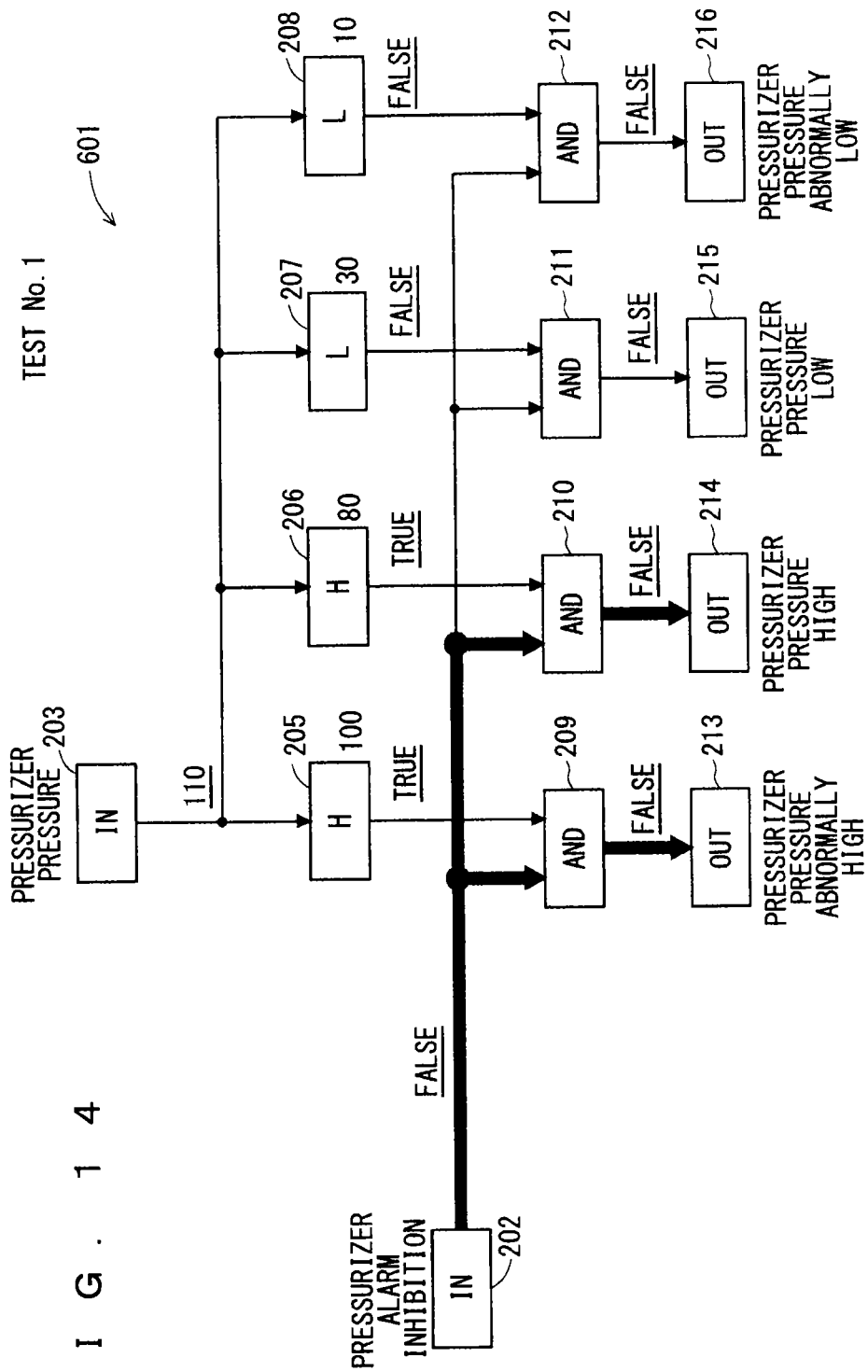
FIG. 14 shows a result indicating whether each signal line in the logic diagram is correct or incorrect (test No. 1).
Figure 15:
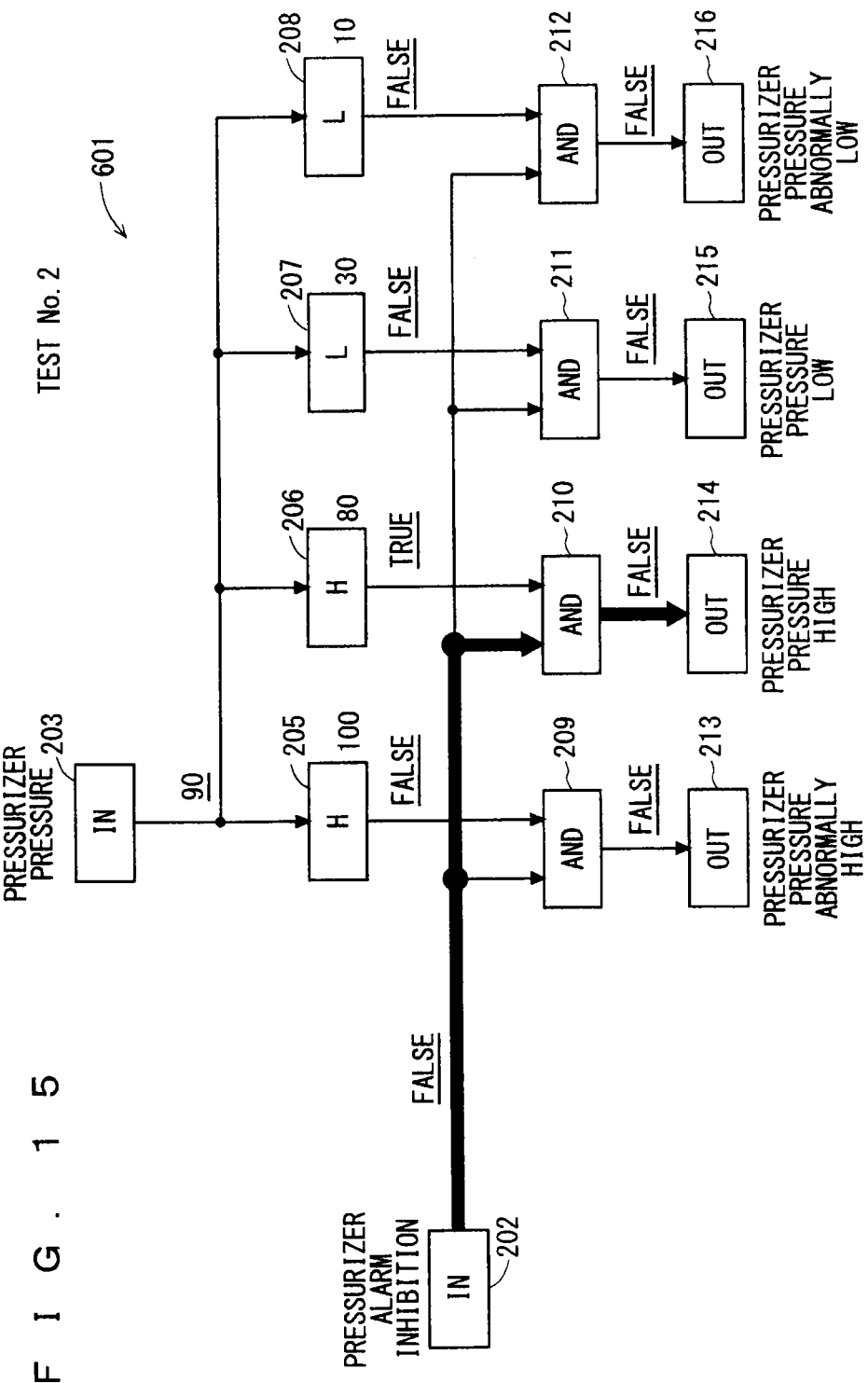
FIG. 15 shows a result indicating whether each signal line in the logic diagram is correct or incorrect (test No. 2).

FIG. 14 shows a result obtained relating to the test No. 1 by the signal line correctness/incorrectness determining unit 105 indicating whether each signal line in the logic diagram 601 is correct or incorrect. In the logic diagram 601 shown in FIG. 14, respective signal lines of the pressurizer pressure abnormally high signal output 213 and the pressurizer pressure high signal output 214 determined to be error signal lines by the signal line correctness/incorrectness determining unit 105 are illustrated in a display style (here, with bold black arrows) that allows these signal lines to be distinguished from the other signal lines.

As a result of the aforementioned operation by the signal line correctness/incorrectness determining unit 105 and the signal line tracking unit 106, the correctness or incorrectness of each signal line in the logic diagram 601 is determined relating to the test No. 1. Steps S3 to S6 are performed on each of the tests in the test table 401, so that similar determination to the aforementioned determination relating to the test No. 1 is also made eventually relating to the tests Nos. 2 to 5. FIGS. 15 to 18 show results of determinations relating to the tests Nos. 2 to 5 respectively about the correctness or incorrectness of each signal line in the same format as in FIG. 14.

The following describes signal line correctness/incorrectness determination results relating to the test No. 3 (FIG. 16) from among those tests. Output values of signal line status values (FIG. 9) relating to the test No. 3 all agree with corresponding output values in the test table 401, so that the test No. 3 is determined to be OK (FIG. 12). Thus, the signal line tracking unit 106 selects a tracking rule about a correct signal line from among the tracking rules of FIG. 13. Based on the selected tracking rule about a correct signal line, the signal line tracking unit 106 tracks signal lines from a signal line on an output side in agreement with a corresponding output value in the test table 401 (here, respective signal lines of the pressurizer pressure abnormally high signal output 213, the pressurizer pressure high signal output 214, the pressurizer pressure low signal output 215, and the pressurizer pressure abnormally low signal output 216) toward a signal line on an input side.

The logical AND operators 209, 210, 211, and 212 are described immediately before the pressurizer pressure abnormally high signal output 213, the pressurizer pressure high signal output 214, the pressurizer pressure low signal output 215, and the pressurizer pressure abnormally low signal output 216 respectively. Thus, the signal line tracking unit 106 selects a tracking rule about a logical AND operator from among the tracking rule about a correct signal line. The tracking rule about a logical AND operator mentioned herein is a tracking rule shown in FIG. 13 that defines that "a signal line of an input value TRUE (1) is to be tracked if an output value is TRUE (1) and tracking is to be finished if the output value is FALSE (0)." Then, based on the selected tracking rule, the signal line tracking unit 106 tracks signal lines from the respective signal lines of the pressurizer pressure abnormally high signal output 213, the pressurizer pressure high signal output 214, the pressurizer pressure low signal output 215, and the pressurizer pressure abnormally low signal output 216.

Figure 9:
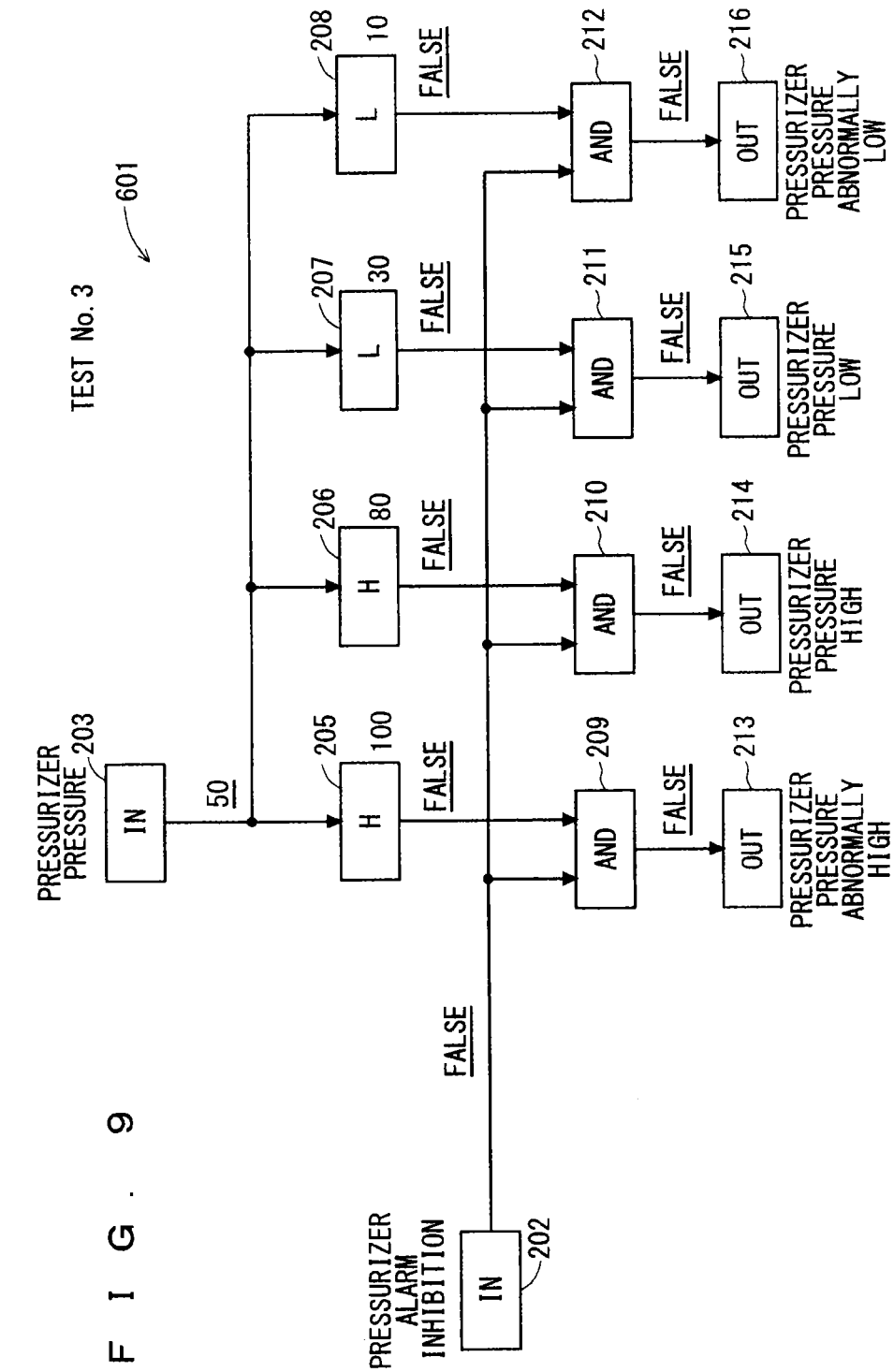
FIG. 9 shows signal line status values (test No. 3) in the logic diagram.
Figure 10:
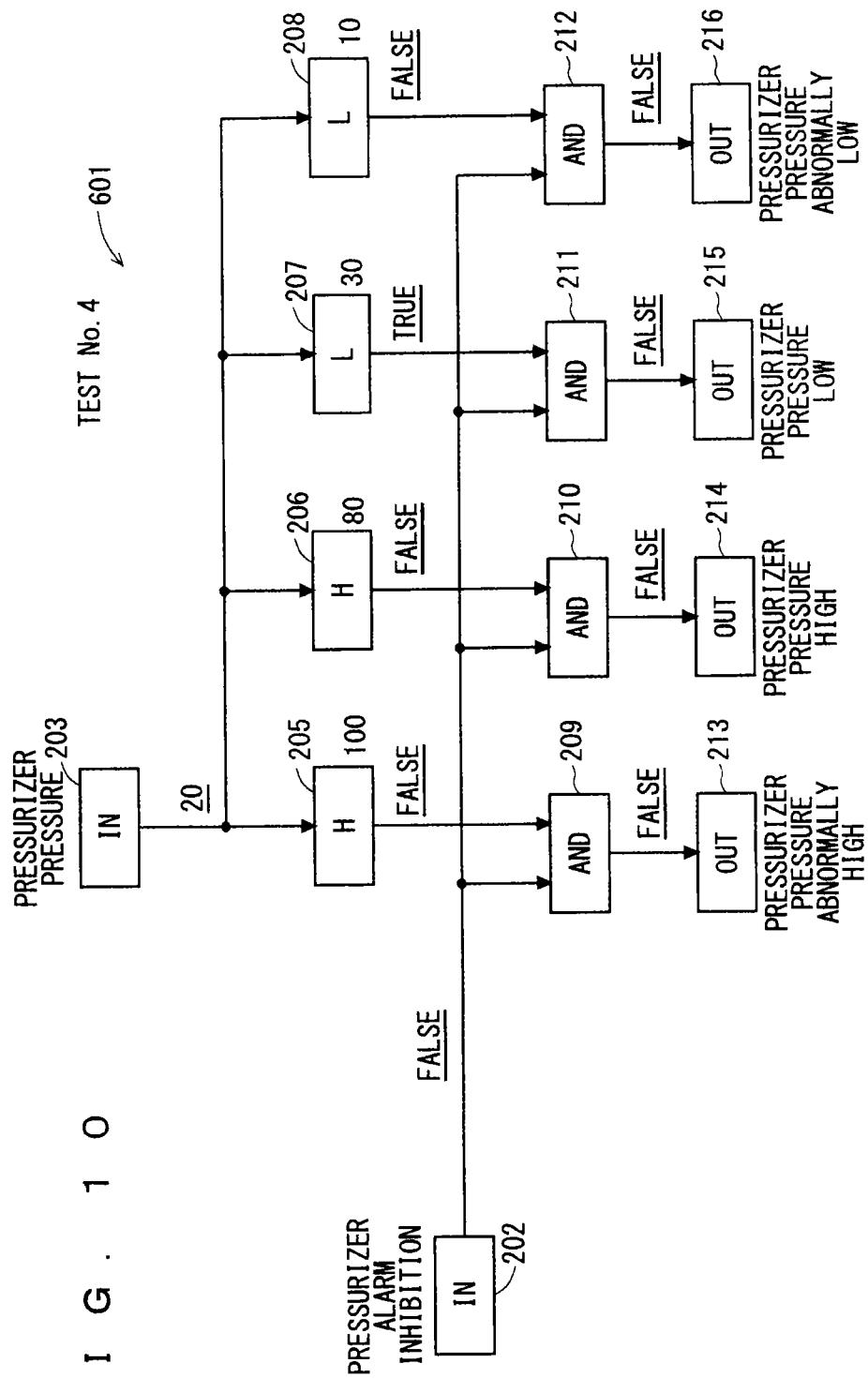
FIG. 10 shows signal line status values (test No. 4) in the logic diagram.

Regarding the signal line status values in the logic diagram 601 relating to the test No. 3 shown in FIG. 9, respective status values of signal lines input to the pressurizer pressure abnormally high signal output 213, the pressurizer pressure high signal output 214, the pressurizer pressure low signal output 215, and the pressurizer pressure abnormally low signal output 216 are all "FALSE (0)." Thus, the signal line tracking unit 106 omits tracking a signal line relating to the test No. 3 based on the aforementioned selected tracking rule (defining that tracking is to be finished if an output value is FALSE (0)).

Figure 16:
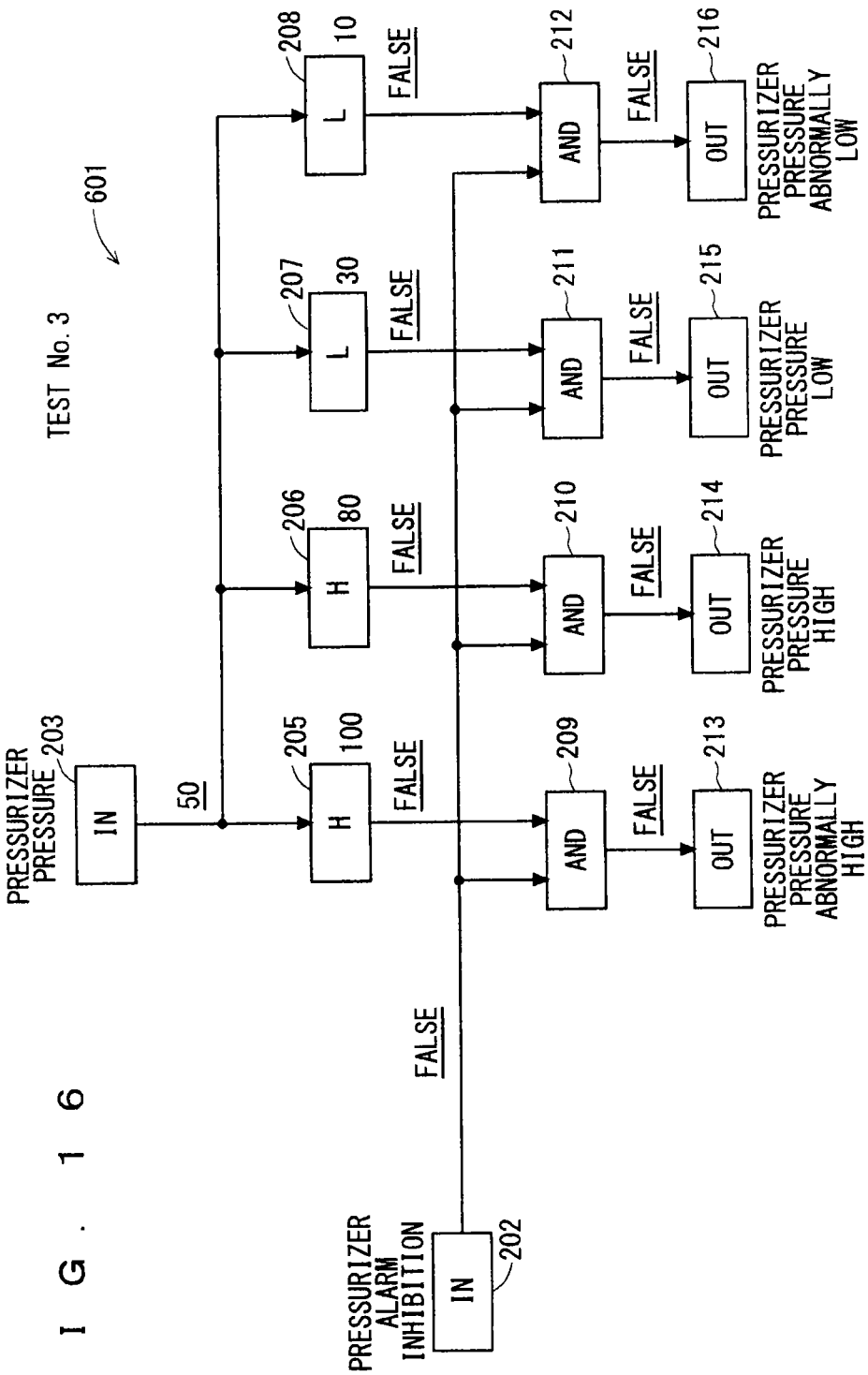
FIG. 16 shows a result indicating whether each signal line in the logic diagram is correct or incorrect (test No. 3).
Figure 17:
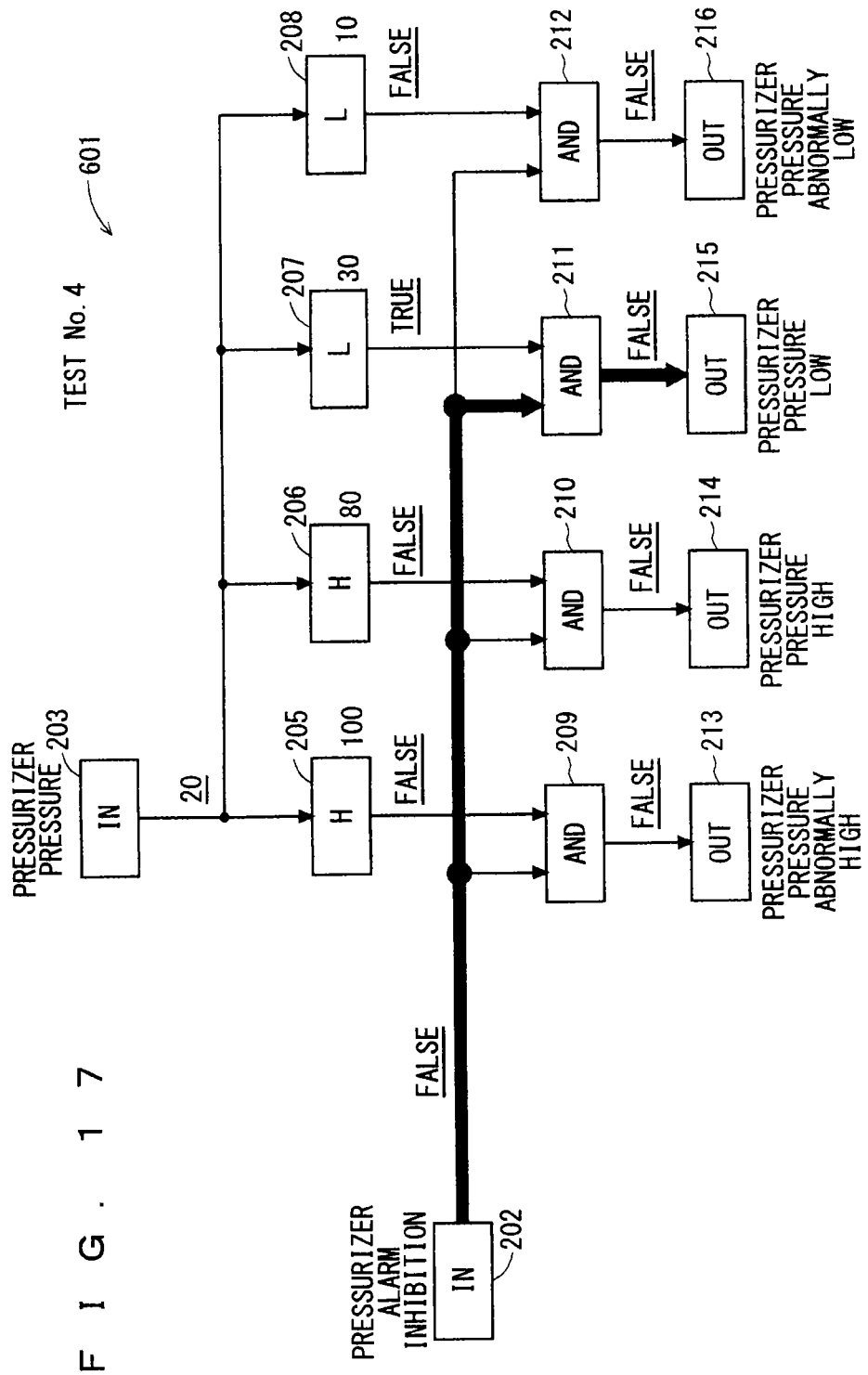
FIG. 17 shows a result indicating whether each signal line in the logic diagram is correct or incorrect (test No. 4).
Figure 18:
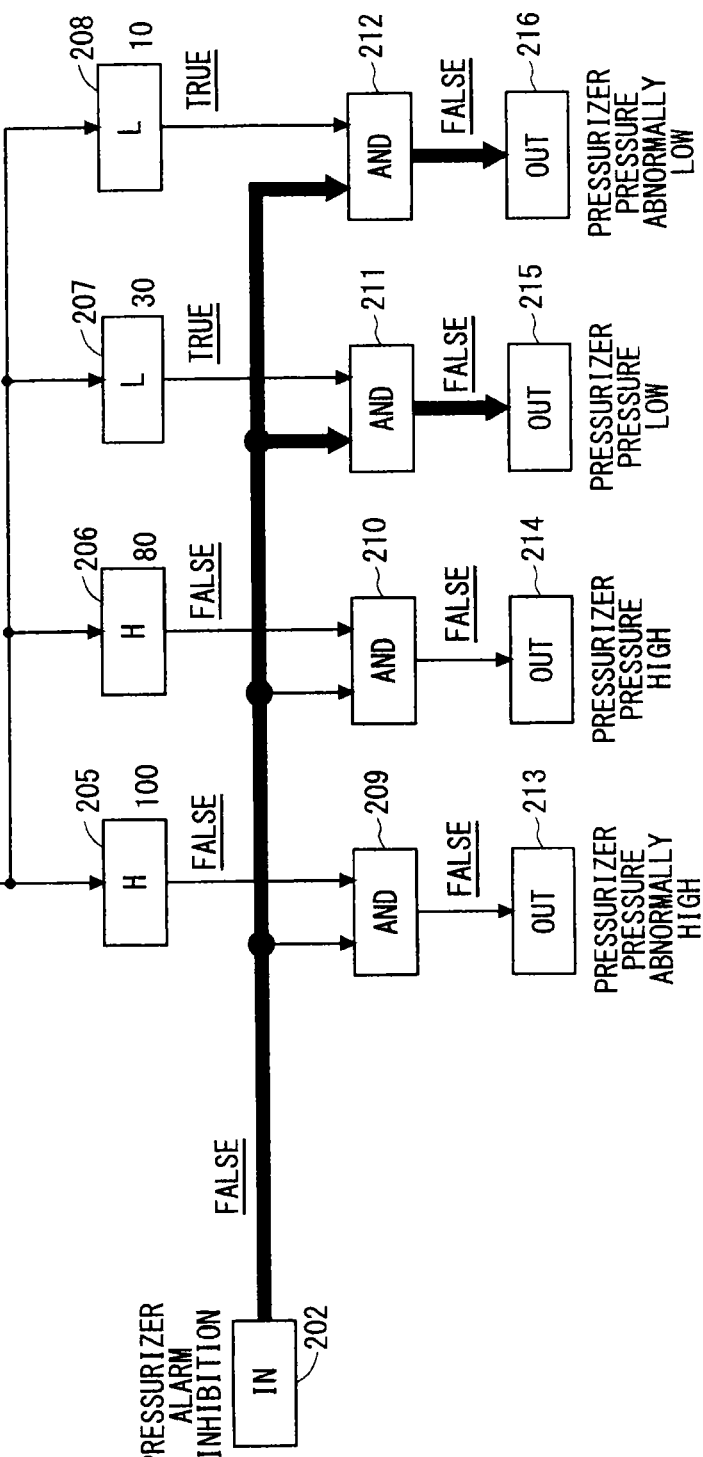
FIG. 18 shows a result indicating whether each signal line in the logic diagram is correct or incorrect (test No. 5).

Then, the signal line correctness/incorrectness determining unit 105 determines all signal lines to be "correct signal lines" having been tracked by the signal line tracking unit 106 based on the tracking rule about a correct signal line. In the aforementioned example, the signal line tracking unit 106 does not do such tracking. Thus, none of the signal lines is determined to be a correct signal line as shown in FIG. 16.

Referring back to FIG. 5, it is determined in step S6 whether all the tests (here, tests Nos. 1 to 5) have been subjected to the aforementioned processes in steps S3 to S5. If all the tests are determined to be subjected to these processes, the flow proceeds to step S7. If all the tests are not determined to be subjected to these processes, the flow returns to step S3 to perform the processes in steps S3 to S5 on an unprocessed test.

In step S7, the signal line correctness/incorrectness result summarizing unit 107 summarizes correctness/incorrectness determination results about each signal line relating to all the tests given by the signal line correctness/incorrectness determining unit 105, thereby calculating a correctness/incorrectness result summarized value of each signal line. In this embodiment, the signal line correctness/incorrectness result summarizing unit 107 calculates the correctness/incorrectness result summarized value of each signal line according to the following calculation formula:

Correctness/incorrectness result summarized value of focused signal line=The number of tests by which focus signal line is determined to be error signal line/(The number of tests by which any signal line is determined to be error signal line+The number of tests by which focus signal line is determined to be correct signal line)

In this formula, "the number of tests by which any signal line is determined to be error signal line" is the same as the number of tests determined to be NG in step S4.

In the aforementioned example, there are four NGs in the test result table 1201. Thus, "the number of tests by which any signal line is determined to be error signal line is four." Further, none of the signal lines in the logic diagram 601 is determined to be a correct signal line. Thus, "the number of tests by which focus signal line is determined to be correct signal line is 0." The logic diagram 601 shown in FIG. 19 additionally includes a correctness/incorrectness result summarized value of each signal line as an underlined value calculated by the signal line correctness/incorrectness result summarizing unit 107.

In step S8, the error signal line estimating unit 108 estimates an error probability in each signal line based on the correctness/incorrectness result summarized value of each signal line calculated by the signal line correctness/incorrectness result summarizing unit 107. In this embodiment, the error signal line estimating unit 108 determines a signal line with a correctness/incorrectness result summarized value of "0" to be a signal line of "no error probability," a signal line with a maximum correctness/incorrectness result summarized value "4/4" to be a signal line of a "high error probability," a signal line with a minimum correctness/incorrectness result summarized value "1/4" except 0 to be a signal line of a "low error probability," and a signal line with a different correctness/incorrectness result summarized value to be a signal line of a "medium error probability." In the logic diagram 601 shown in FIG. 19, an error probability in each signal line estimated by the error signal line estimating unit 108 is indicated by the width and the like of this signal line.

Figure 19:
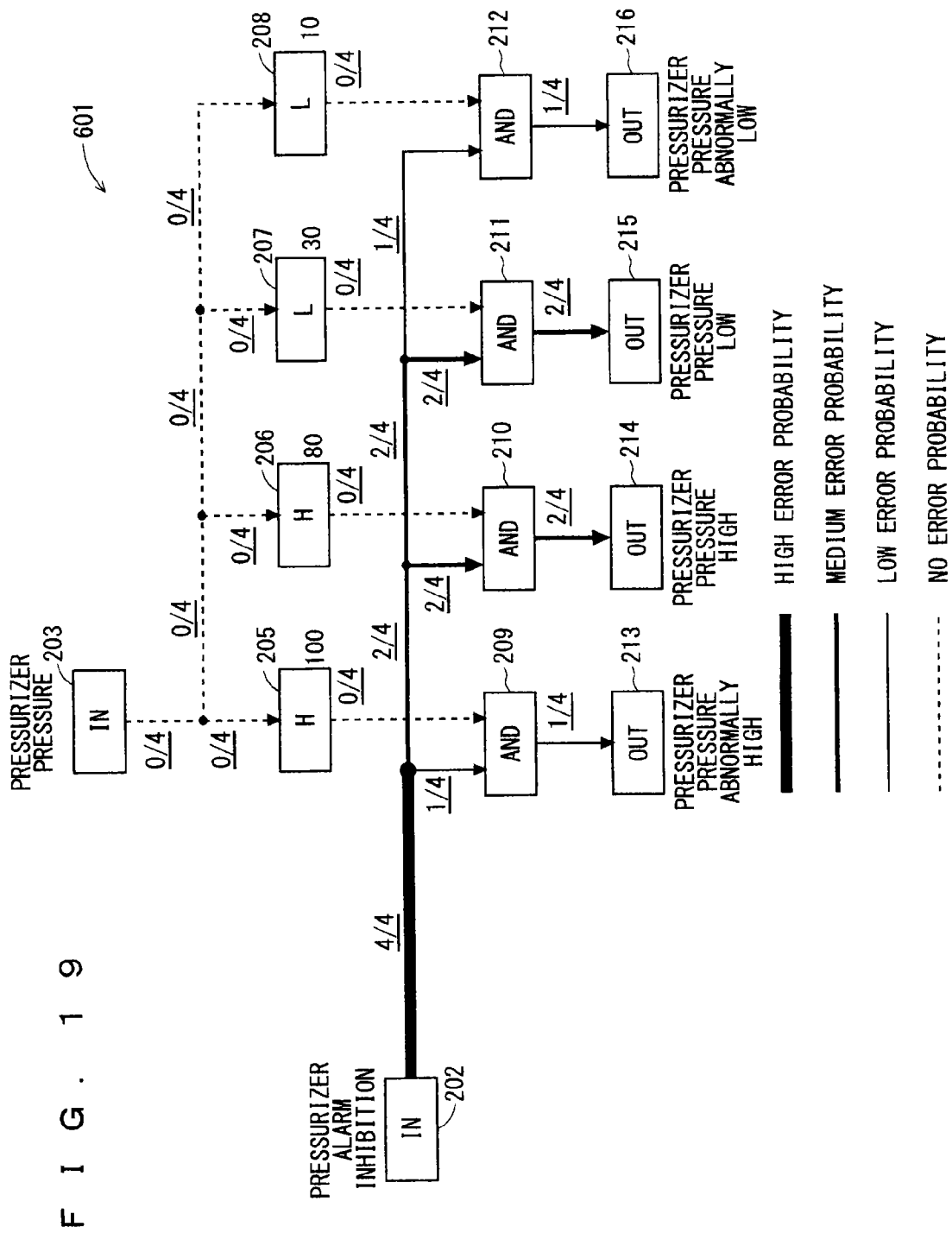
FIG. 19 shows a correctness/incorrectness result summarized value and an error probability, of each signal line in the logic diagram.

In step S9, the display 109 displays each signal line in the logic diagram 601 in a display style by which the error probability in each signal line estimated by the error signal line estimating unit 108 can be distinguished. As an example of such display, a signal line may be shown to be narrower in response to a decreasing error probability from high to medium to low and a signal line with no probability may be shown by a dashed line as shown in FIG. 19. This allows a user having looked at the logic diagram 601 displayed by the display 109 to know that an error probability is high in the vicinity of the pressurizer alarm inhibit signal input 202. As a result, the user can easily find missing of the NOT operator 204 shown in FIG. 2.

<Second Exemplary Operation>

Figure 20:
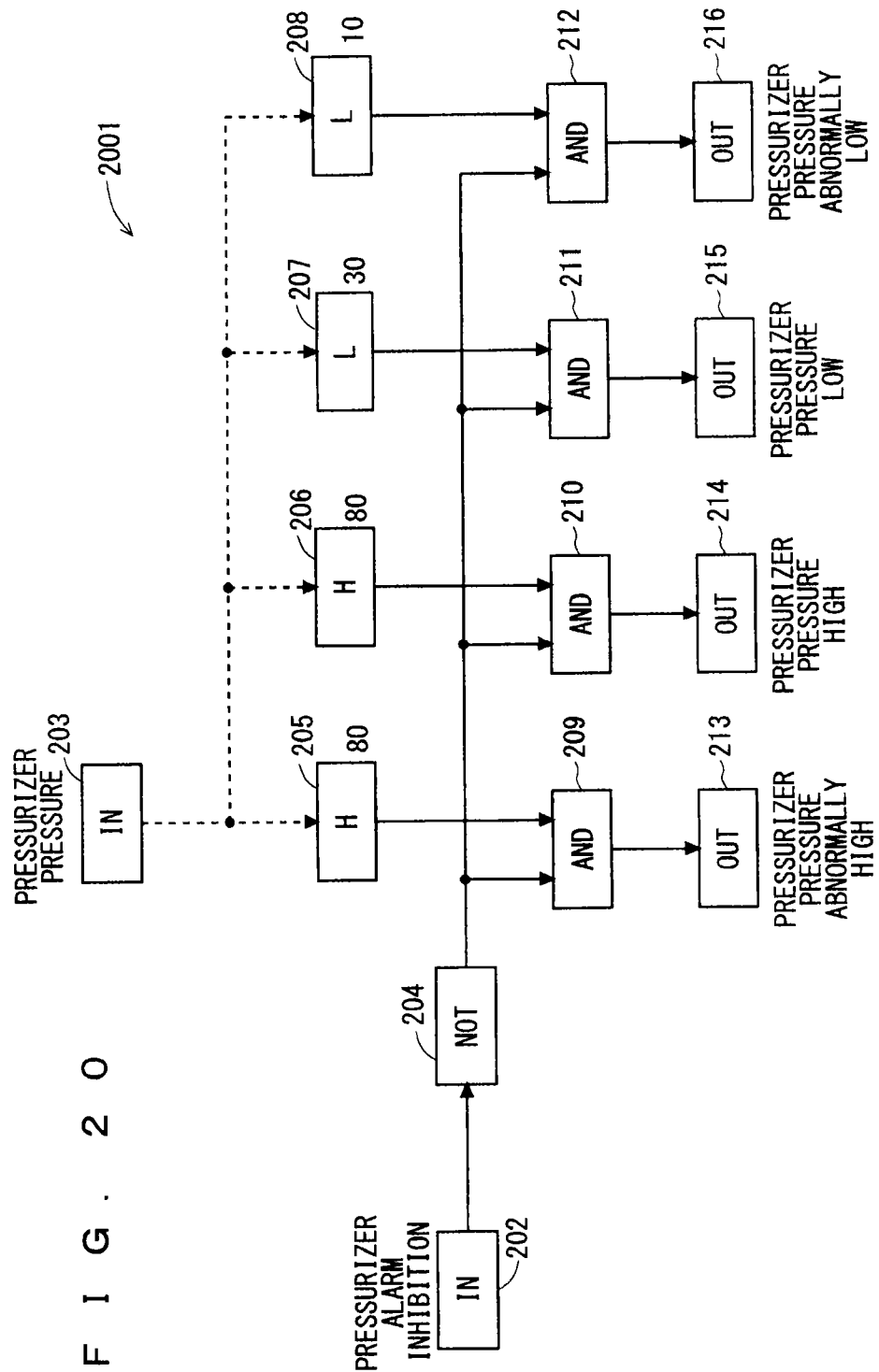
FIG. 20 shows an example of a logic diagram.

Second exemplary operation is intended for the operation of the logic diagram display device of this embodiment on a logic diagram 2001 shown in FIG. 20. In comparison with the logic diagram 201 of FIG. 2, the logic diagram 2001 includes an error in that a set value for the upper limit monitor operator 205, that should be "100" correctly, is "80." Even in this case, the operation by the logic diagram display device of this embodiment shown in FIG. 5 still allows a user to find an error point (error in the set value for the upper limit monitor operator 205) in the logic diagram 2001 easily.

Like in the aforementioned example, before step S1 (FIG. 5) is performed, the logic diagram 2001 is stored in the logic diagram storage 101 and a signal line status value in the logic diagram 2001 is stored in the signal line status value storage 103.

Figure 21:
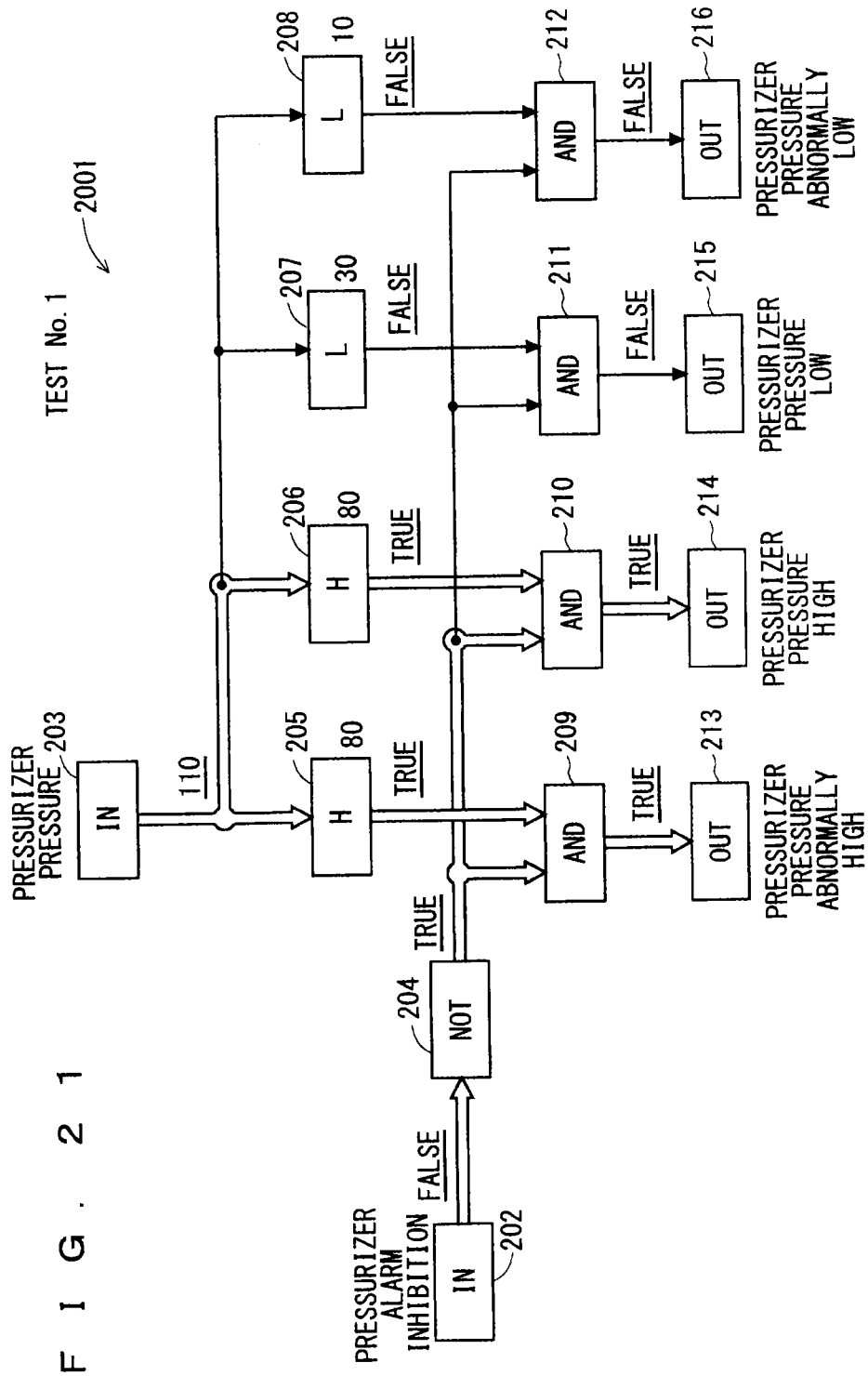
FIG. 21 shows signal line status values in the logic diagram and a result indicating whether each signal line in the logic diagram is correct or incorrect (test No. 1).
Figure 23:
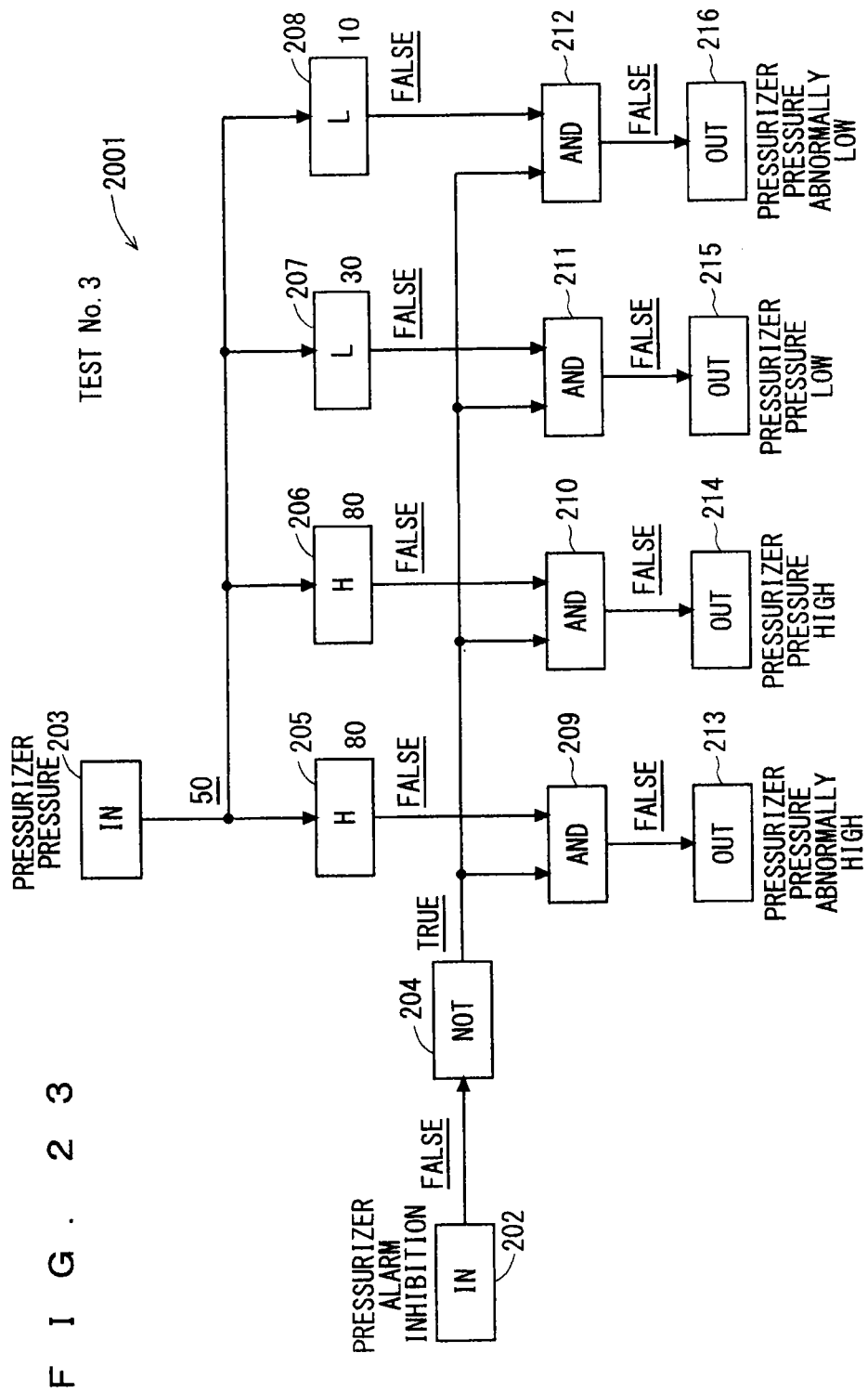
FIG. 23 shows signal line status values in the logic diagram and a result indicating whether each signal line in the logic diagram is correct or incorrect (test No. 3).
Figure 24:
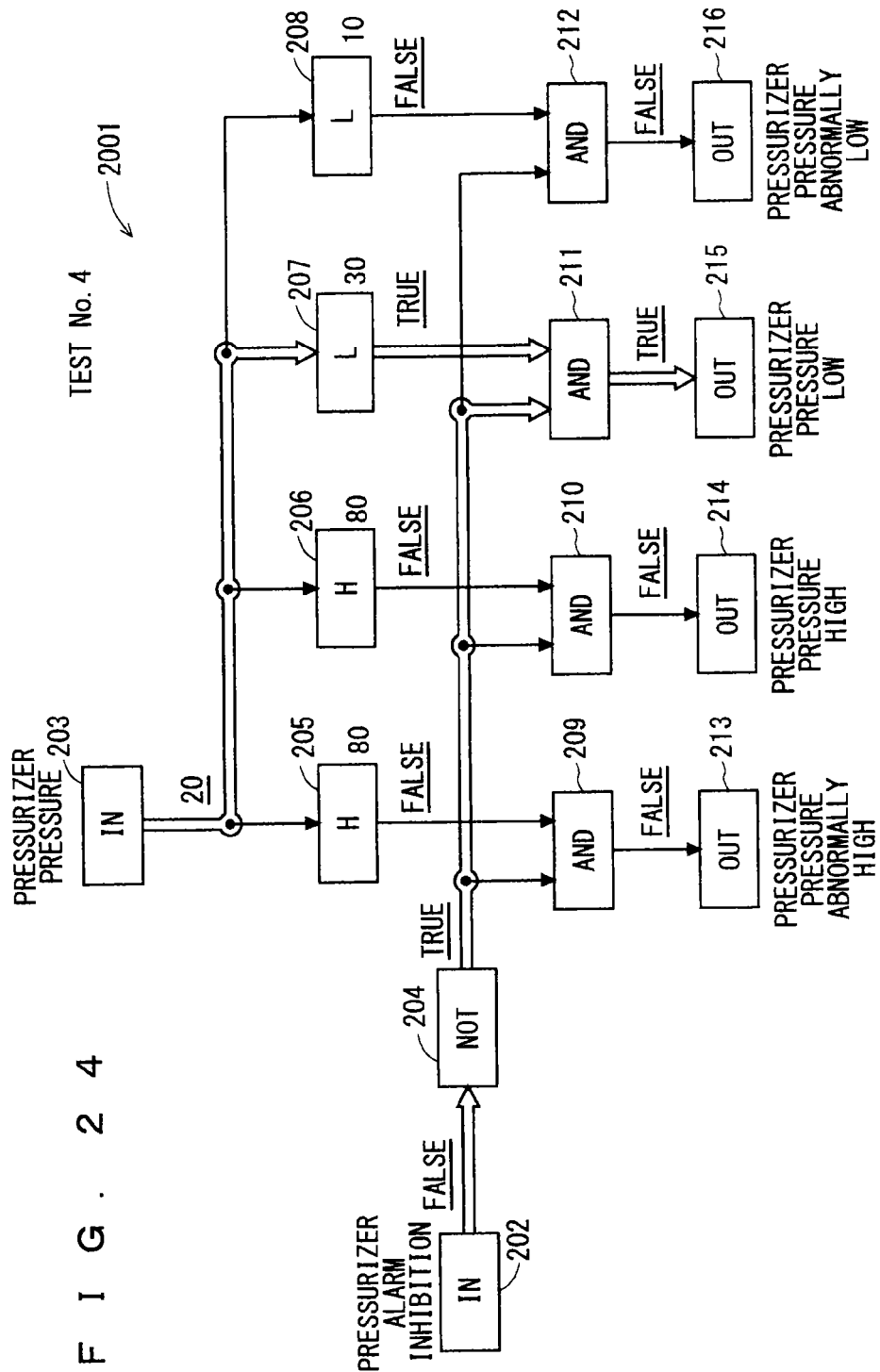
FIG. 24 shows signal line status values in the logic diagram and a result indicating whether each signal line in the logic diagram is correct or incorrect (test No. 4).
Figure 25:
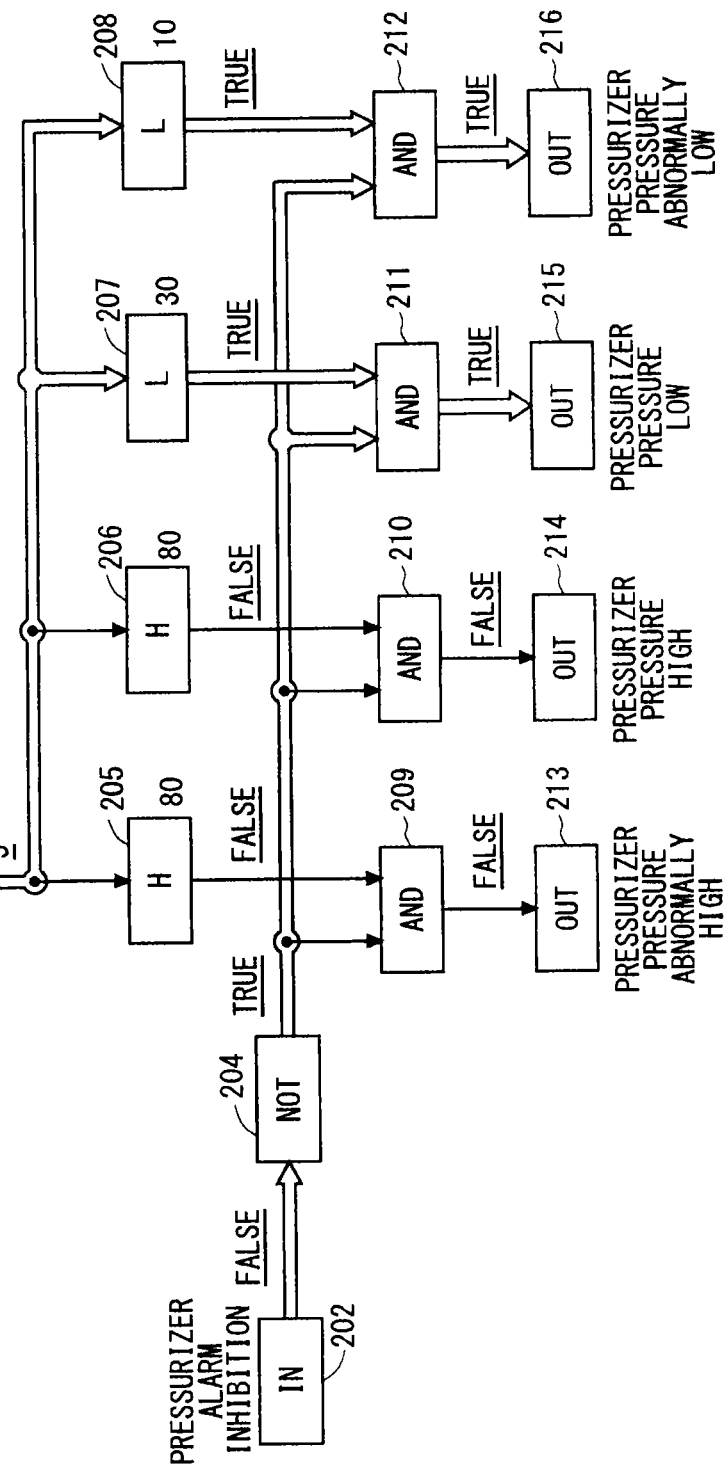
FIG. 25 shows signal line status values in the logic diagram and a result indicating whether each signal line in the logic diagram is correct or incorrect (test No. 5).

More specifically, like in the aforementioned example, the signal line status value acquiring unit 104 conducts each test in the test table 401 on the logic diagram 2001. As a result, the signal line status value acquiring unit 104 acquires a status value of each signal line (result of arithmetic operation), specifically a signal line status value in the logic diagram 2001. The logic diagram 2001 shown in FIG. 21 additionally includes signal line status values shown as underlined values (TRUE or FALSE) acquired by conducting the test No. 1 in the test table 401 on the logic diagram 2001.

The acquisition of the signal line status values (FIG. 21) for the test No. 1 added to the logic diagram 2001 is described in detail next. According to the test No. 1, an analog value "110" is input from the pressurizer pressure signal input 203 to the upper limit monitor operators 205 and 206 and the lower limit monitor operators 207 and 208. In response, the upper limit monitor operators 205 and 206 each output a digital value "TRUE (1)" whereas the lower limit monitor operators 207 and 208 each output a digital value "FALSE (0)." According to the test No. 1, a digital value "FALSE (0)" as an output of the pressurizer alarm inhibit signal input 202 is input to the NOT operator 204. In response, the NOT operator 204 outputs an inverted digital value "TRUE (1)."

The logical AND operators 209 and 210 respectively receive outputs of the upper limit monitor operators 205 and 206 ("TRUE (1)") and each receive the digital value "TRUE (1)" output from the NOT operator 204. Thus, the logical AND operators 209 and 210 each output a digital value "TRUE (1)." As a result, the digital value "TRUE (1)" is set as each of the pressurizer pressure abnormally high signal output 213 and the pressurizer pressure high signal output 214. Further, the logical AND operators 211 and 212 respectively receive outputs of the lower limit monitor operators 207 and 208 ("FALSE (0)") and each receive the digital value "TRUE (1)" output from the NOT operator 204. Thus, the logical AND operators 211 and 212 each output a digital value "FALSE (0)." As a result, the digital value "FALSE (0)" is set as each of the pressurizer pressure low signal output 215 and the pressurizer pressure abnormally low signal output 216.

The signal line status value acquiring unit 104 conducts the tests Nos. 2 to 5 on the logic diagram 2001 in the same way as that of conducting the test No. 1, thereby acquiring signal line status values in the logic diagrams 2001 for the tests Nos. 2 to 5. FIGS. 22 to 25 show a signal line status value of each signal line relating to the tests Nos. 2 to 5 respectively shown in the same format as in FIG. 21. The signal line status value acquiring unit 104 stores the acquired signal line status values into the signal line status value storage 103.

Referring back to FIG. 5, the operation of the logic diagram display device of this embodiment in step S1 and in its subsequent steps is described next. The signal line correctness/incorrectness determining unit 105 mentioned herein reads the test table 401 in step S1, and reads the logic diagram 2001 in step S2. Then, in step S3, the signal line status value acquiring unit 104 reads a signal line status value (here, the signal value status values shown in FIG. 21) corresponding to a pertinent test (here, the test No. 1) in the test table 401, and provides the read signal line status value to the signal line correctness/incorrectness determining unit 105.

In step S4, the signal line correctness/incorrectness determining unit 105 compares an output value of the signal line status value (here, the signal line status values shown in FIG. 21) given from the signal line status value acquiring unit 104 and an output value (expected value) in the test table (here, the test table 401) read in step S1 with each other to determine whether the pertinent test (here, the test No. 1) is correct or incorrect.

FIG. 26 shows a test result table 2601 in which output values of signal line status values in the logic diagram 2001 are collected relating to each test, specifically, results obtained by conducting the aforementioned tests Nos. 1 to 5 on the logic diagram 2001 are collected. The test result table 2601 includes respective input value of pressurizer pressure and pressurizer alarm inhibition same as those in the test table 401, and respective output values of signal line status values on pressurizer pressure abnormally high, pressurizer pressure high, pressurizer pressure low, and pressurizer pressure abnormally low shown in FIGS. 21 to 25, specifically output values actually obtained by conducting the tests Nos. 1 to 5. The particulars of the test result table 2601 are the same as those of the test result table 1201 (FIG. 12).

As an example, output values of signal line status values on the pressurizer pressure abnormally high signal output 213 and the pressurizer pressure high signal output 214 relating to the test No. 1 shown in the test result table 2601 are "TRUE (1)." Output values of signal line status values on the pressurizer pressure low signal output 215 and the pressurizer pressure abnormally low signal output 216 relating to the test No. 1 shown in the test result table 2601 are "FALSE (0)." Meanwhile, relating to the test No. 1 shown in the test table 401, respective desired output values (expected values) of the pressurizer pressure abnormally high signal output 213 and the pressurizer pressure high signal output 214 are "TRUE (1)," and respective desired output values (expected values) of the pressurizer pressure low signal output 215 and the pressurizer pressure abnormally low signal output 216 are "FALSE (0)."

An output value of a signal line status value agrees with an expected value relating to all the outputs of the test No. 1. Thus, the signal line correctness/incorrectness determining unit 105 determines the test No. 1 to be "OK." As a result, "OK" is described in the result column relating to the test No. 1 in the test result table 2601 (FIG. 26). Results are also described in the result column relating to the tests Nos. 2 to 5.

In step S5, the signal line tracking unit 106 tracks signal lines from an output side toward an input side of a logic diagram relating to the pertinent test based on a signal line status value of each signal line, an output value in a test table, and a tracking rule determined for each type of an arithmetic element in the logic diagram. Then, in step S5, the signal line correctness/incorrectness determining unit 105 determines for the pertinent test whether each signal line in the logic diagram is correct or incorrect based on a result of the tracking by the signal line tracking unit 106.

The following describes a specific example of the operation of tracking signal lines from an output side toward an input side of the logic diagram 2001 relating to the test No. 1 by the signal line tracking unit 106.

Output values of signal line status values (FIG. 21) relating to the test No. 1 all agree with corresponding output values in the test table 401, so that the test No. 1 is determined to be OK (FIG. 26). Thus, the signal line tracking unit 106 selects a tracking rule about a correct signal line from among the tracking rules of FIG. 13. Based on the selected tracking rule about a correct signal line, the signal line tracking unit 106 tracks signal lines from a signal line on an output side in agreement with a corresponding output value in the test table 401 (here, respective signal lines of the pressurizer pressure abnormally high signal output 213, the pressurizer pressure high signal output 214, the pressurizer pressure low signal output 215, and the pressurizer pressure abnormally low signal output 216) toward a signal line on an input side.

The logical AND operators 209, 210, 211, and 212 are described immediately before the pressurizer pressure abnormally high signal output 213, the pressurizer pressure high signal output 214, the pressurizer pressure low signal output 215, and the pressurizer pressure abnormally low signal output 216 respectively. Thus, the signal line tracking unit 106 selects a tracking rule about a logical AND operator from among the tracking rule about a correct signal line. The tracking rule about a logical AND operator mentioned herein is a tracking rule shown in FIG. 13 that defines that "a signal line of an input value TRUE (1) is to be tracked if an output value is TRUE (1) and tracking is to be finished if the output value is FALSE (0)." Then, based on the selected tracking rule, the signal line tracking unit 106 tracks signal lines from the respective signal lines of the pressurizer pressure abnormally high signal output 213, the pressurizer pressure high signal output 214, the pressurizer pressure low signal output 215, and the pressurizer pressure abnormally low signal output 216.

More specifically, regarding the signal line status values in the logic diagram 2001 relating to the test No. 1 (FIG. 21), a status value of a signal line input to the pressurizer pressure abnormally high signal output 213 is "TRUE (1)." Thus, the signal line tracking unit 106 tracks a signal line of an input value "TRUE (1)" from among signal lines giving inputs to the logical AND operator 209. By repeating tracking in this way, the signal line tracking unit 106 gets to the pressurizer alarm inhibit signal input 202 and the pressurizer pressure signal input 203. Then, the signal line tracking unit 106 finishes tracking signal lines. The signal line tracking unit 106 tracks a series of signal lines from the pressurizer pressure high signal output 214 to the pressurizer alarm inhibit signal input 202 and a series of signal lines from the pressurizer pressure high signal output 214 to the pressurizer pressure signal input 203 in the same way.

Meanwhile, status values of signal lines input to the pressurizer pressure low signal output 215 and the pressurizer pressure abnormally low signal output 216 are "FALSE (0)." Thus, the signal line tracking unit 106 omits tracking a correct signal line based on the aforementioned selected tracking rule (defining that tracking is to be finished if an output value is FALSE (0)).

Then, the signal line correctness/incorrectness determining unit 105 determines all signal lines to be "correct signal lines" having been tracked by the signal line tracking unit 106 based on the tracking rule about a correct signal line. In the aforementioned example, the signal line correctness/incorrectness determining unit 105 determines that a series of signal lines from the pressurizer pressure abnormally high signal output 213 to the pressurizer alarm inhibit signal input 202, a series of signal lines from the pressurizer pressure abnormally high signal output 213 to the pressurizer pressure signal input 203, a series of signal lines from the pressurizer pressure high signal output 214 to the pressurizer alarm inhibit signal input 202, and a series of signal lines from the pressurizer pressure high signal output 214 to the pressurizer pressure signal input 203, are "correct signal lines." In the logic diagram 2001 shown in FIG. 21, signal lines determined to be correct signal lines by the signal line correctness/incorrectness determining unit 105 are illustrated in a display style (here, with hollow bold arrows) that allows these signal lines to be distinguished from the other signal lines.

As a result of the aforementioned operation by the signal line correctness/incorrectness determining unit 105 and the signal line tracking unit 106, the correctness or incorrectness of each signal line in the logic diagram 2001 is determined relating to the test No. 1. Steps S3 to S6 are performed on each of the tests in the test table 401, so that similar determination to the aforementioned determination relating to the test No. 1 is also made eventually relating to the tests Nos. 2 to 5. FIGS. 22 to 25 show respective results of determinations relating to the tests Nos. 2 to 5 respectively about the correctness or incorrectness of each signal line.

Figure 27:
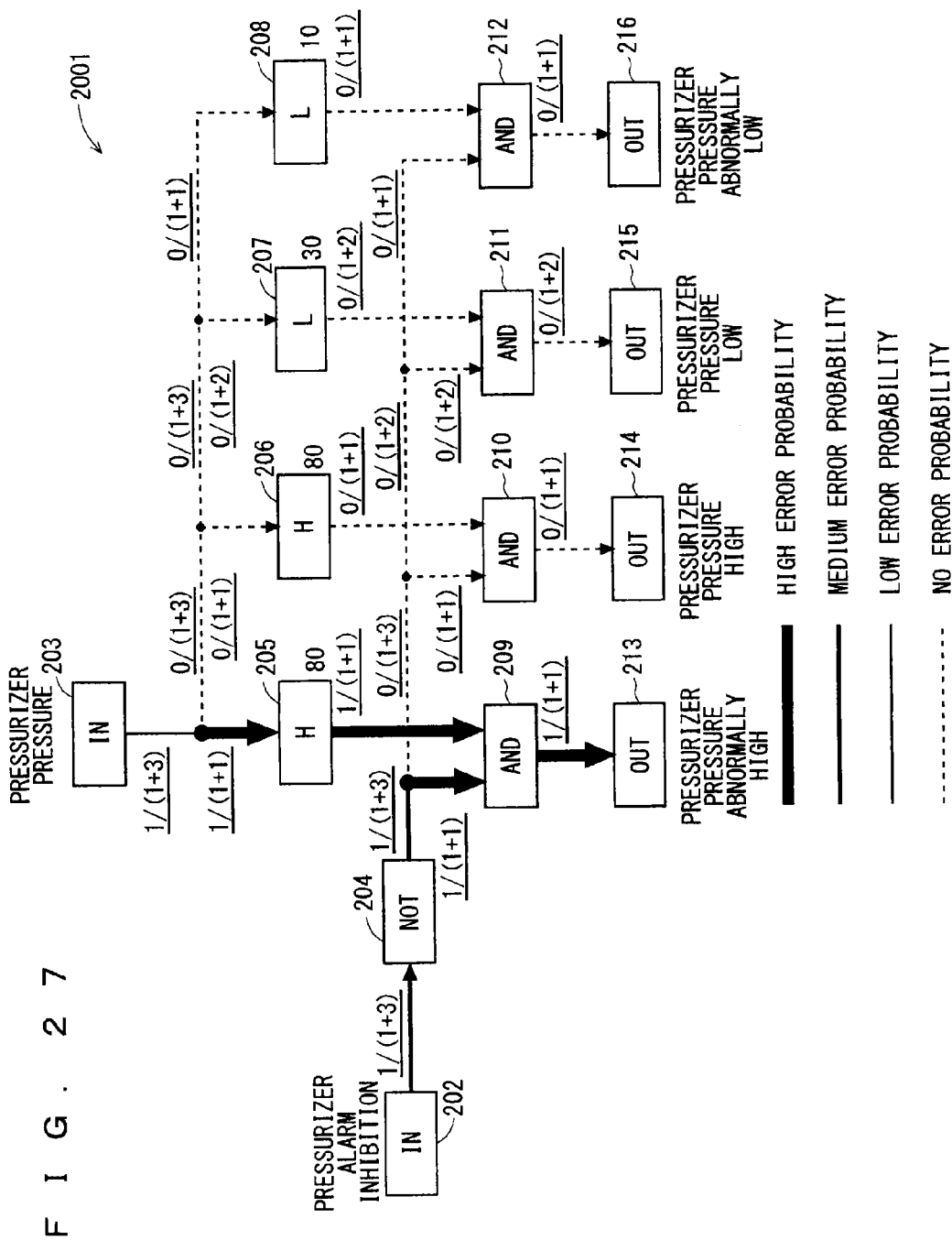
FIG. 27 shows a correctness/incorrectness result summarized value and an error probability, of each signal line in the logic diagram.

Referring back to FIG. 5, steps S6 to S9 are performed after step S5. The logic diagram 2001 shown in FIG. 27 additionally includes a correctness/incorrectness result summarized value of each signal line as an underlined value calculated by the signal line correctness/incorrectness result summarizing unit 107. In the logic diagram 2001 shown in FIG. 27, an error probability in each signal line estimated by the error signal line estimating unit 108 in step S8 is indicated by the width and the like of this signal line. In the example shown in FIG. 27, the error signal line estimating unit 108 determines a signal line with a correctness/incorrectness result summarized value of "0" to be a signal line of "no error probability," a signal line with a maximum correctness/incorrectness result summarized value "2/1" to be a signal line of a "high error probability," and a signal line with a minimum correctness/incorrectness result summarized value "1/4" except 0 to be a signal line of a "low error probability."

In step S9, the display 109 displays each signal line in the logic diagram 2001 in a display style by which an error probability in, each signal line estimated by the error signal line estimating unit 108 can be distinguished. This allows a user having looked at the logic diagram 2001 displayed by the display 109 to know that an error probability is high in an area from a branch point between the pressurizer pressure signal input 203 and the upper limit monitor operator 205 to the upper limit monitor operator 205, the logical AND operator 209, and the pressurizer pressure abnormally high signal output 213. As a result, the user can easily find the error in the set value for the upper limit monitor operator 205.

According to the aforementioned logic diagram display device and the method of this embodiment, the signal line correctness/incorrectness determining unit 105 determines for each test whether each signal line in a logic diagram is correct or incorrect based on a signal line status value. The signal line correctness/incorrectness result summarizing unit 107 calculates a correctness/incorrectness result summarized value of each signal line based on a result of this determination. The error signal line estimating unit 108 estimates an error in each signal in the logic diagram based on the correctness/incorrectness result summarized value of each signal line. The display 109 displays a signal line in the logic diagram in a display style responsive to the error in each signal line. As a result, preparation such as generation of a fault dictionary becomes unnecessary while an error point in the logic diagram can be estimated in a short calculation time.

In the above description, the signal line status value acquiring unit 104 acquires a signal status value and stores the acquired status value into the signal line status value storage 103 before the processes shown in the flowchart of FIG. 5 is started. However, this is given not for limitation. Alternatively, the signal line status value acquiring unit 104 may acquire a signal line status value in preparation for each of the processes in the flowchart of FIG. 5. This delays the processes in the flowchart of FIG. 5 by a period of time required for computing (acquiring) a signal line status value. However, this in turn makes the signal line status value storage 103 unnecessary.

The embodiment of the present invention can be modified or omitted where appropriate without departing from the scope of the invention.

Second Embodiment

Figure 28:
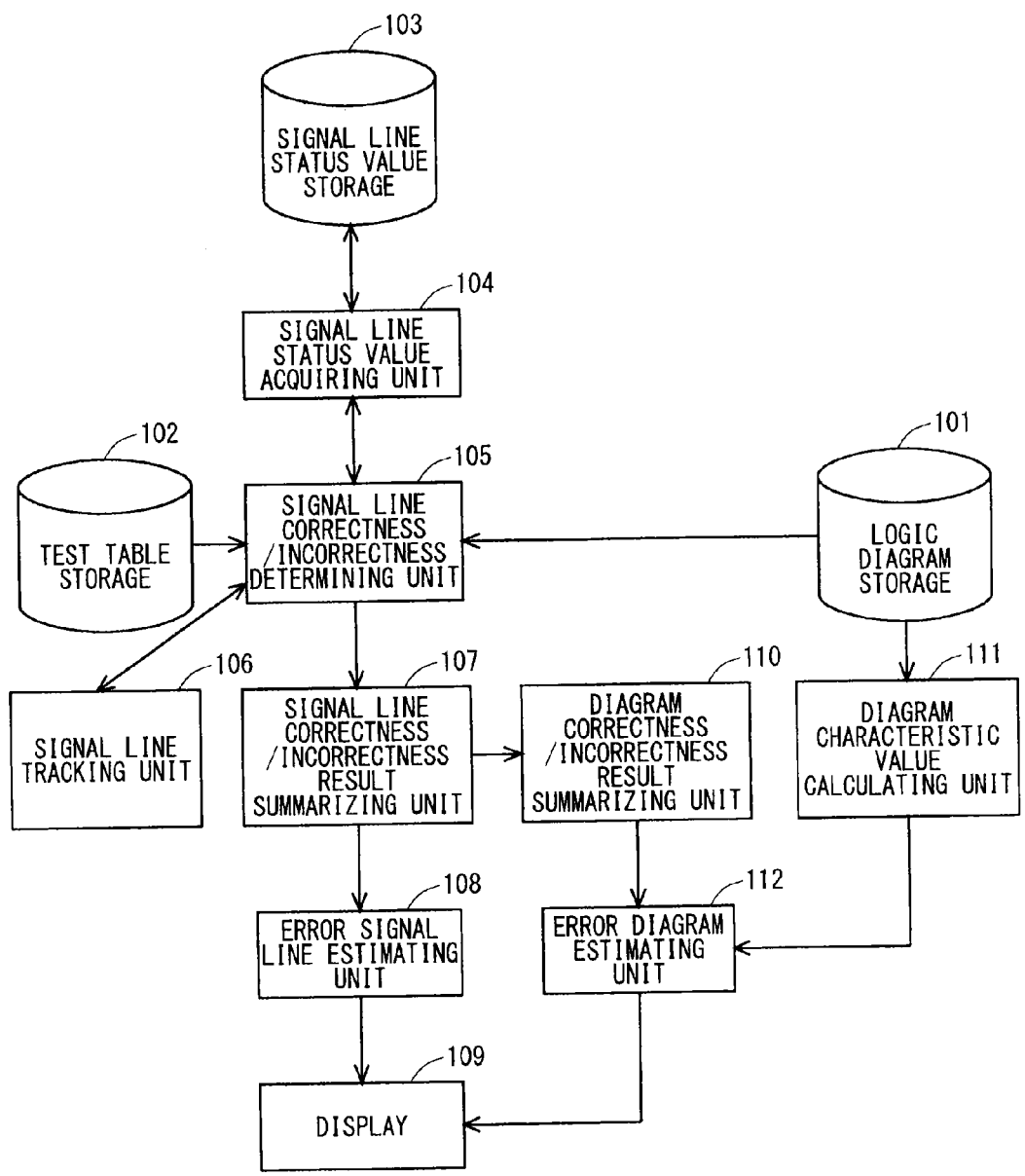
FIG. 28 is a block diagram showing the structure of a logic diagram display device of a first embodiment.

FIG. 28 is a block diagram showing the structure of a logic diagram display device of a second embodiment of the present invention. Components of the logic diagram display device of this embodiment same as or similar to those described in the first embodiment are identified by the same signs. The following mainly describes a difference from the first embodiment.

The logic diagram display device of this embodiment is formed by adding a diagram correctness/incorrectness result summarizing unit 110, a diagram characteristic value calculating unit 111, and an error diagram estimating unit 112 to the logic diagram display device of the first embodiment.

The diagram correctness/incorrectness result summarizing unit 110 calculates a correctness/incorrectness result summarized value of each of a plurality of logic diagrams based on a correctness/incorrectness result summarized value of each signal line calculated by the signal line correctness/incorrectness result summarizing unit 107. The diagram correctness/incorrectness result summarizing unit 110 mentioned herein calculates the maximum of a correctness/incorrectness result summarized value of each signal line in each logic diagram, as a correctness/incorrectness result summarized value of each logic diagram.

The diagram characteristic value calculating unit 111 analyzes each logic diagram and calculates a diagram characteristic value of each logic diagram.

The error diagram estimating unit 112 estimates an error in each logic diagram based on a correctness/incorrectness result summarized value of each logic diagram calculated by the diagram correctness/incorrectness result summarizing unit 110. The error diagram estimating unit 112 mentioned herein estimates an error in each logic diagram based on a correctness/incorrectness result summarized value of each logic diagram calculated by the diagram correctness/incorrectness result summarizing unit 110 and a diagram characteristic value of each logic diagram calculated by the diagram characteristic value calculating unit 111. An error in each logic diagram to be estimated by the error diagram estimating unit 112 includes the presence or absence of an error in each logic diagram and the probability of each logic diagram being erroneous, for example. In this embodiment, an error in each logic diagram to be estimated means the probability of each logic diagram being erroneous (hereinafter called an "error probability in each logic diagram").

The display 109 displays a logic diagram in a display style responsive to an error probability in each logic diagram estimated by the error diagram estimating unit 112. The display 109 mentioned herein displays a plurality of logic diagrams in a display style by which an error probability in each logic diagram estimated by the error diagram estimating unit 112 can be distinguished.

The logic diagram display device of the aforementioned structure of this embodiment estimates an error signal line in a logic diagram group stored in the logic diagram storage 101 and displays the estimated error signal line in the logic diagram group.

Figure 29:
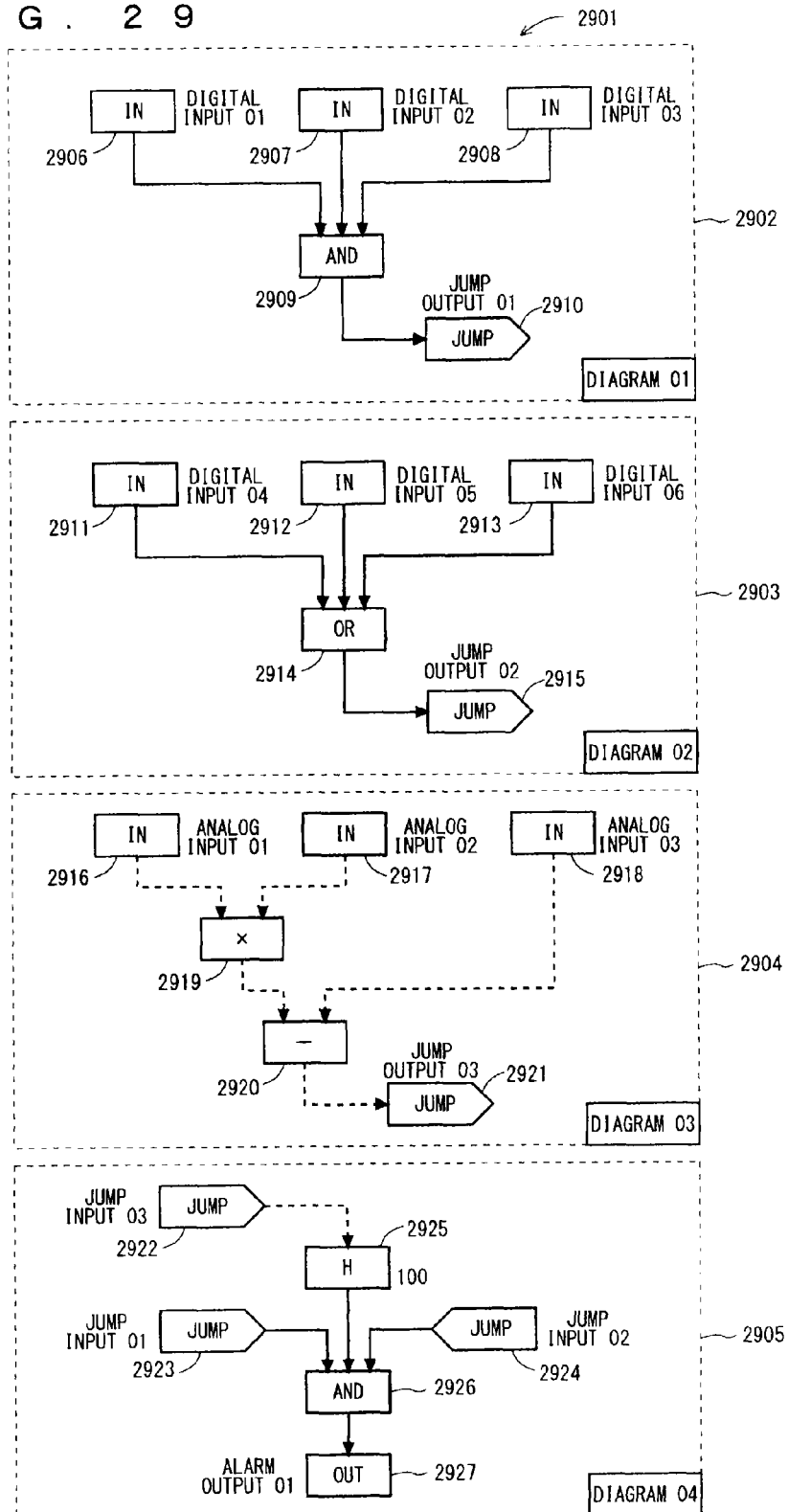
FIG. 29 shows an example of a logic diagram group.

FIG. 29 shows an example of a logic diagram group. A logic diagram group 2901 shown in FIG. 29 includes four logic diagrams 2902 to 2905. One control logic is separated into these logic diagrams 2902 to 2905.

Respective signal lines in the logic diagrams 2902 to 2905 are connected logically by jump operators described in the rules shown in FIG. 3 defining description of arithmetic elements and others. An output of a jump operator 2910 in a logic diagram 01 (2902) is input to a jump operator 2923 in a logic diagram 04 (2905). Likewise, an output of a jump operator 2915 in a logic diagram 02 (2903) is input to a jump operator 2924 in the logic diagram 04 (2905), and an output of a jump operator 2921 in a logic diagram 03 (2904) is input to a jump operator 2922 in the logic diagram 04 (2905). The logic diagram 2904 includes an arithmetic element 2919 for multiplication and an arithmetic element 2920 for subtraction.

FIG. 30 shows an example of a test table stored in the test table storage 102. A test table 3001 shown in FIG. 30 includes a combination of input values and desired output values (expected values) in a table format relating to each of tests Nos. 1 to 4. The logic diagrams 2902 to 2905 shown in FIG. 29 are to give output values same as corresponding output values relating to each test in the test table 3001 in response to entry of input values relating to each test in the test table 3001. Thus, the logic diagrams 2902 to 2905 are determined to be correct according to the test table 3001.

<Operation>

Figure 31:
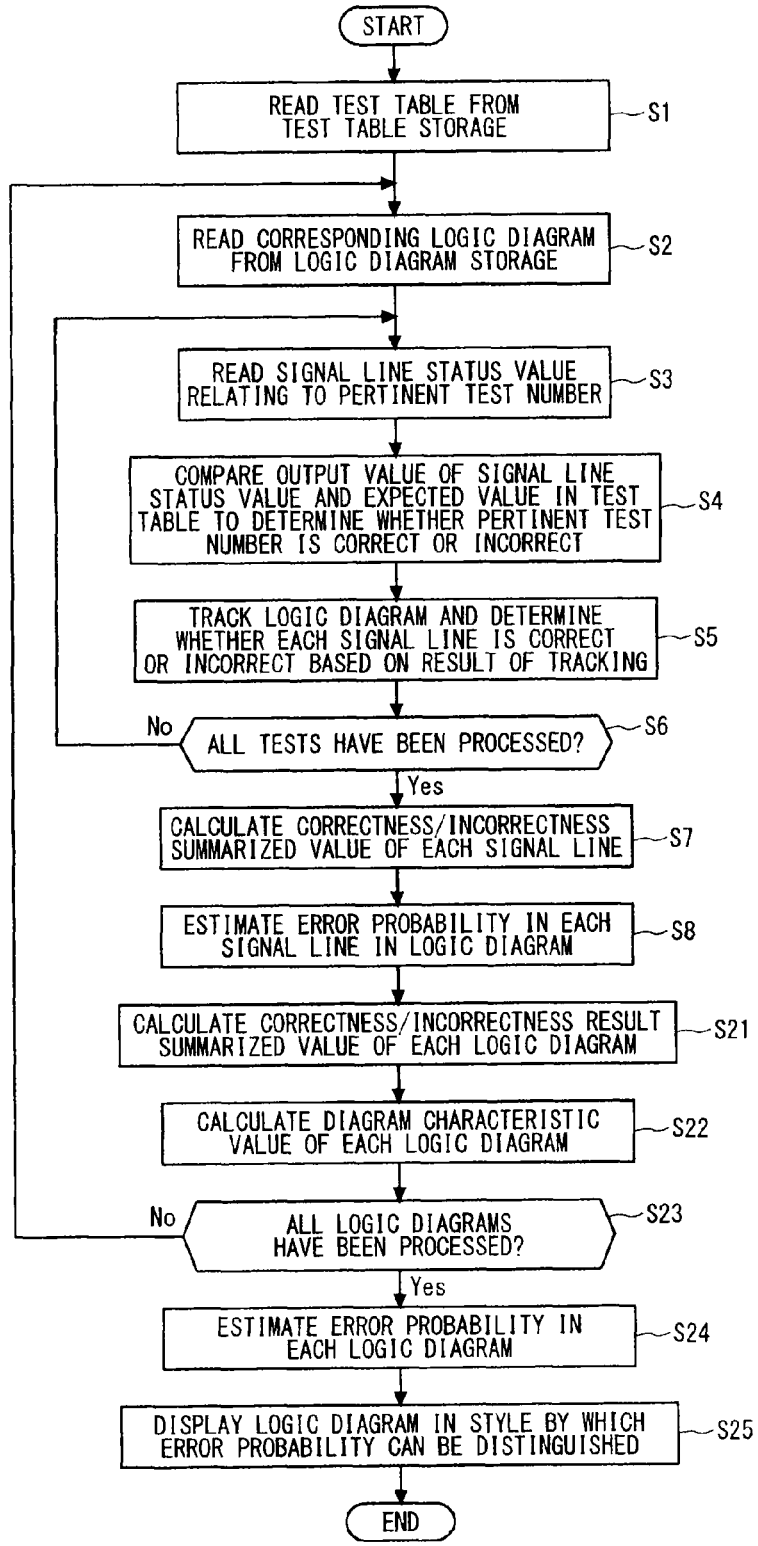
FIG. 31 is a flowchart showing the operation of the logic diagram display device of the second embodiment.

FIG. 31 is a flowchart showing the operation of estimating an error signal line in a plurality of logic diagrams in a logic diagram group and displaying the estimated error signal line in these logic diagrams by the logic diagram display device of this embodiment. The following describes the details of operation by the logic diagram display device of this embodiment, including estimating an error point by using the test table 3001 by which the logic diagrams 2902 to 2905 are determined to be correct. The flowchart shown in FIG. 31 includes steps S1 to S8 described in the first embodiment and steps S21 to S25. The following mainly describes steps S21 to S25.

Figure 32:
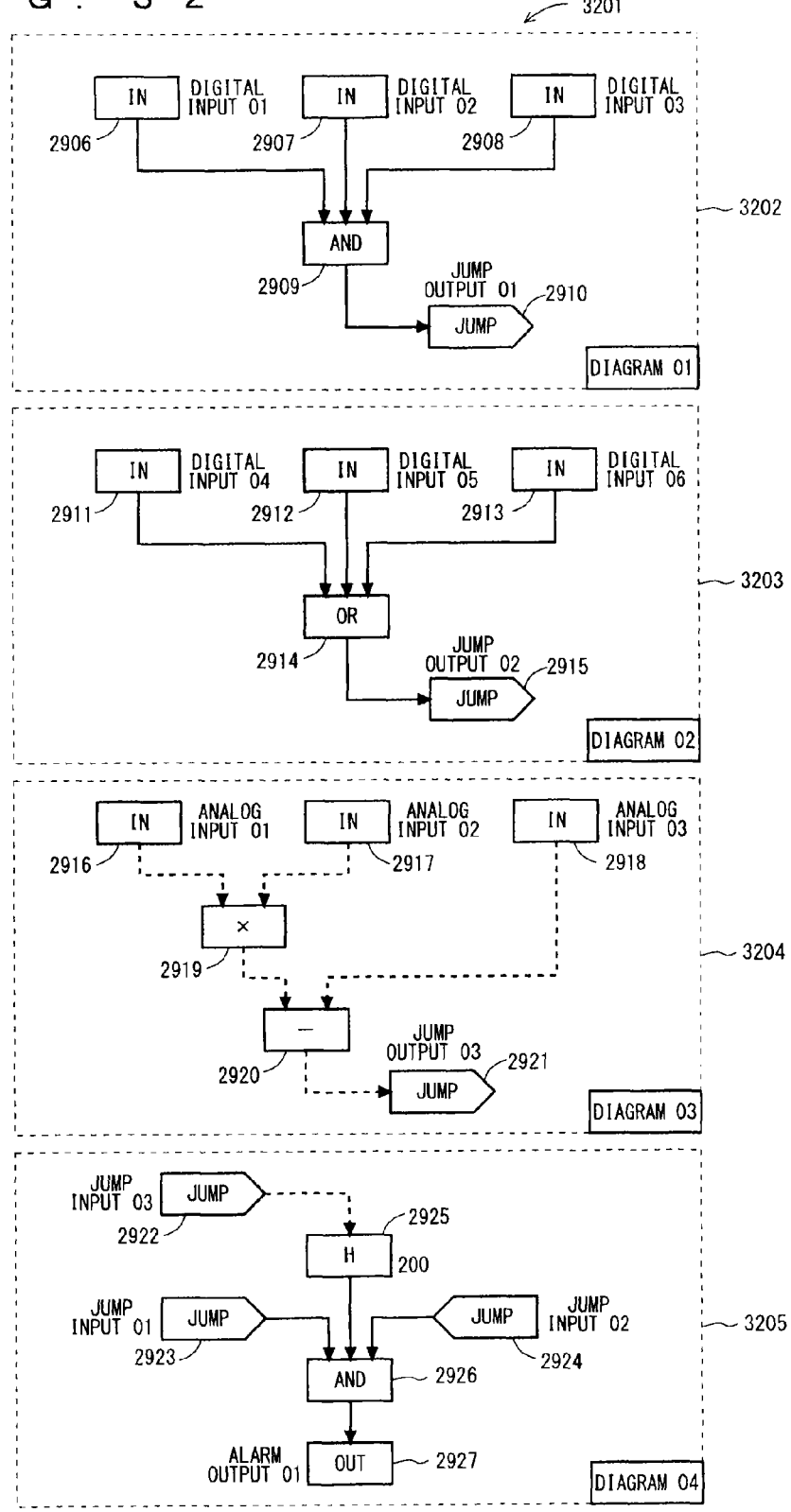
FIG. 32 shows an example of a logic diagram group.

The following describes the operation of the logic diagram display device of this embodiment on four logic diagrams 3202 to 3205 in a logic diagram group 3201 shown in FIG. 32. In comparisons with the logic diagrams 2902 to 2905 of FIG. 29 respectively, the logic diagrams 3202 to 3205 include an error in that a set value for an upper limit monitor operator 2925, that should be "100" correctly, is "200" in the logic diagram 3205. As described below, the operation by the logic diagram display device of this embodiment shown in FIG. 31 allows a user to find an error point (error in the set value for the upper limit monitor operator 2925) in the logic diagram 3205 easily.

Like in the first embodiment, before step S1 of FIG. 31 is performed, the logic diagrams 3202 to 3205 are stored in the logic diagram storage 101 and signal line status values in the logic diagrams 3202 to 3205 are stored in the signal line status value storage 103 in this embodiment. The logic diagrams 3202 to 3205 shown in FIG. 33 additionally include signal line status values shown as underlined values (TRUE or FALSE) acquired by conducting the test No. 3 in the test table 3001 on the logic diagrams 3202 to 3205.

First, steps S1 to S3 of FIG. 31 same as those of the first embodiment are performed. In step S4, like in the first embodiment, the signal line correctness/incorrectness determining unit 105 compares an output value of a signal line status value given from the signal line status value acquiring unit 104 and an output value (expected value) in a test table read in step S1 with each other to determine whether a pertinent test is correct or incorrect.

FIG. 34 shows a test result table 3401 in which output values of signal line status values in the logic diagrams 3202 to 3205 are collected relating to each test, specifically, results obtained by conducting the aforementioned tests Nos. 1 to 4 on the logic diagrams 3202 to 3205 are collected. Like the test result table 1201 (FIG. 12) described in the first embodiment, the test result table 3401 includes a result column in which a result of determination about the correctness or incorrectness (OK, NG) of each test (tests Nos. 1 to 4) determined by the signal line correctness/incorrectness determining unit 105 in step S4 is shown.

Figure 33:
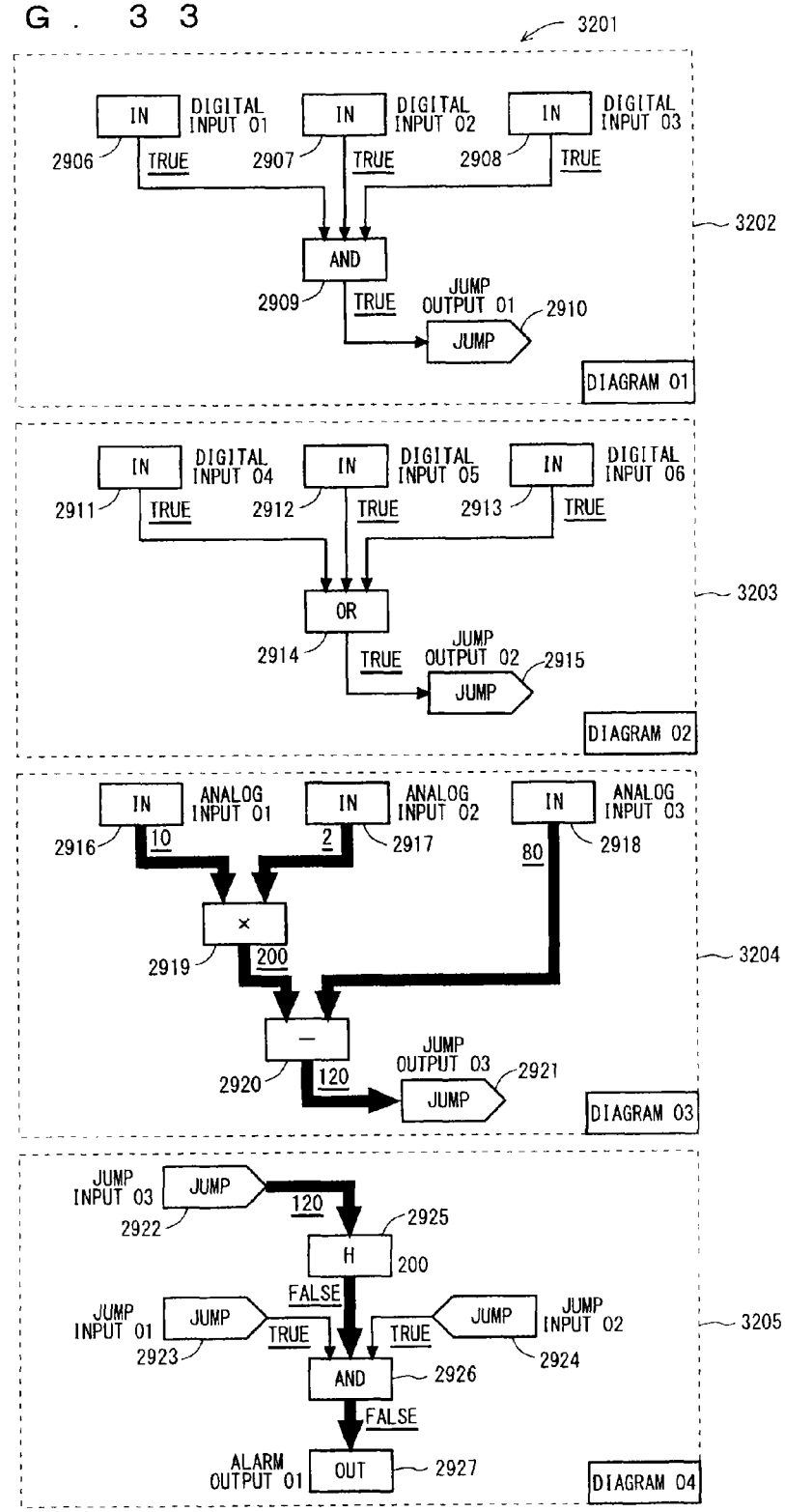
FIG. 33 shows signal line status values in a logic diagram and a result indicating whether each signal line in the logic diagram is correct or incorrect (test No. 3).

In step S5 (FIG. 31), like in the first embodiment, the signal line tracking unit 106 tracks signal lines from an output side toward an input side of a logic diagram relating to the pertinent test based on a signal line status value of each signal line, an output value in a test table, and a tracking rule. Then, in step S5, the signal line correctness/incorrectness determining unit 105 determines for the pertinent test whether each signal line in the logic diagram is correct or incorrect based on a result of the tracking by the signal line tracking unit 106. FIG. 33 shows a result indicating whether each signal line in the logic diagrams 3202 to 3205 is correct or incorrect in the same format as that of the first embodiment. This result is acquired by the signal line correctness/incorrectness determining unit 105 in step S5 for the test No. 3.

Like in the first embodiment, it is determined in step S6 (FIG. 31) whether all the tests (here, tests Nos. 1 to 4) have been subjected to the aforementioned processes in steps S3 to S5. If all the tests are determined to be subjected to these processes, the flow proceeds to step S7. If all the tests are not determined to be subjected to these processes, the flow returns to step S3 to perform the processes in steps S3 to S5 on an unprocessed test.

Thus, step S5 is also performed on the tests Nos. 1, 2 and 4 (FIG. 34) determined to be successful except the test No. 3. Meanwhile, according to the tracking rules of FIG. 13, none of the signal lines in the logic diagrams 3202 to 3205 is determined to be a "correct signal line" as a result of step S5 performed on the test Nos. 1, 2 and 4.

In step S7 (FIG. 31), like in the first embodiment, the signal line correctness/incorrectness result summarizing unit 107 summarizes correctness/incorrectness determination results about each signal line relating to all the tests given by the signal line correctness/incorrectness determining unit 105, thereby calculating a correctness/incorrectness result summarized value of each signal line. The logic diagrams 3202 to 3205 shown in FIG. 35 additionally include a correctness/incorrectness result summarized value of each signal line calculated by the signal line correctness/incorrectness result summarizing unit 107 shown as an underlined value.

In step S8 (FIG. 31), the error signal line estimating unit 108 estimates an error probability in each signal line based on the correctness/incorrectness result summarized value of each signal line calculated by the signal line correctness/incorrectness result summarizing unit 107. In this embodiment, the error signal line estimating unit 108 determines a signal line with a correctness/incorrectness result summarized value of "0" to be a signal line of "no error probability," and a signal line with a maximum correctness/incorrectness result summarized value "1/1" to be a signal line of a "high error probability." In the logic diagrams 3202 to 3205 shown in FIG. 35, an error probability in each signal line estimated by the error signal line estimating unit 108 is indicated by the width and the like of this signal line.

In step S21, the diagram correctness/incorrectness result summarizing unit 110 calculates a correctness/incorrectness result summarized value of each logic diagram (hereinafter also called a "diagram correctness/incorrectness result summarized value" in some cases) based on the correctness/incorrectness result summarized value of each signal line calculated by the signal line correctness/incorrectness result summarizing unit 107. In this embodiment, the diagram correctness/incorrectness result summarized value is the maximum of a correctness/incorrectness result summarized value of each signal line in each logic diagram. The logic diagrams 3202 to 3205 shown in FIG. 35 each include the diagram correctness/incorrectness result summarized value calculated by the diagram correctness/incorrectness result summarizing unit 110 added as a value given in an upper area surrounded by a rectangle on the right side of each of the logic diagrams 3202 to 3205. The respective diagram correctness/incorrectness result summarized values of the logic diagrams 01 (3202) and 02 (3203) are "0/1." The respective diagram correctness/incorrectness result summarized values of the logic diagrams 03 (3204) and 04 (3205) are "1/1."

In step S22, the diagram characteristic value calculating unit 111 calculates a diagram characteristic value of each logic diagram. The diagram characteristic value mentioned in this embodiment includes an index value indicating the likelihood of mixture of an error into a logic diagram. The diagram characteristic value described below is the complexity level of a logic diagram as an example of this index value.

More specifically, a complexity level is defined according to the type of an arithmetic element in a logic diagram as shown in FIG. 36. The diagram characteristic value calculating unit 111 calculates the sum of the complexity levels of arithmetic elements in each logic diagram as the complexity level of this logic diagram. The logic diagrams 3202 to 3205 shown in FIG. 35 each include the diagram characteristic value calculated by the diagram characteristic value calculating unit 111 added as a value given in a lower area surrounded by the rectangle on the right side of each of the logic diagrams 3202 to 3205. The complexity level of the logic diagram 01 (3202) is "6," that of the logic diagram 02 (3203) is "6," that of the logic diagram 03 (3204) is "8," and that of the logic diagram 04 (3205) is "10."

It is determined in step S23 whether all logic diagrams (here, the logic diagrams 3202 to 3205) corresponding to the test table (here, the test table 3001) read in step S1 have been subjected to steps S2 to S8 and steps S21 and S22. If all the logic diagrams are determined to be subjected to these steps, the flow proceeds to step S24. If all the logic diagrams are not determined to be subjected to these steps, the flow returns to step S2 to perform the processes in steps S2 to S8 and in steps S21 and S22 on an unprocessed logic diagram. As a result, steps S2 to S8 and steps S21 and S22 are repeated a number of times corresponding to the number of the logic diagrams in a group read in step S2.

In step S24, the error diagram estimating unit 112 estimates an error probability in each logic diagram based on the diagram correctness/incorrectness result summarized value calculated by the diagram correctness/incorrectness result summarizing unit 110 and the diagram characteristic value of each logic diagram calculated by the diagram characteristic value calculating unit 111.

Figure 35:
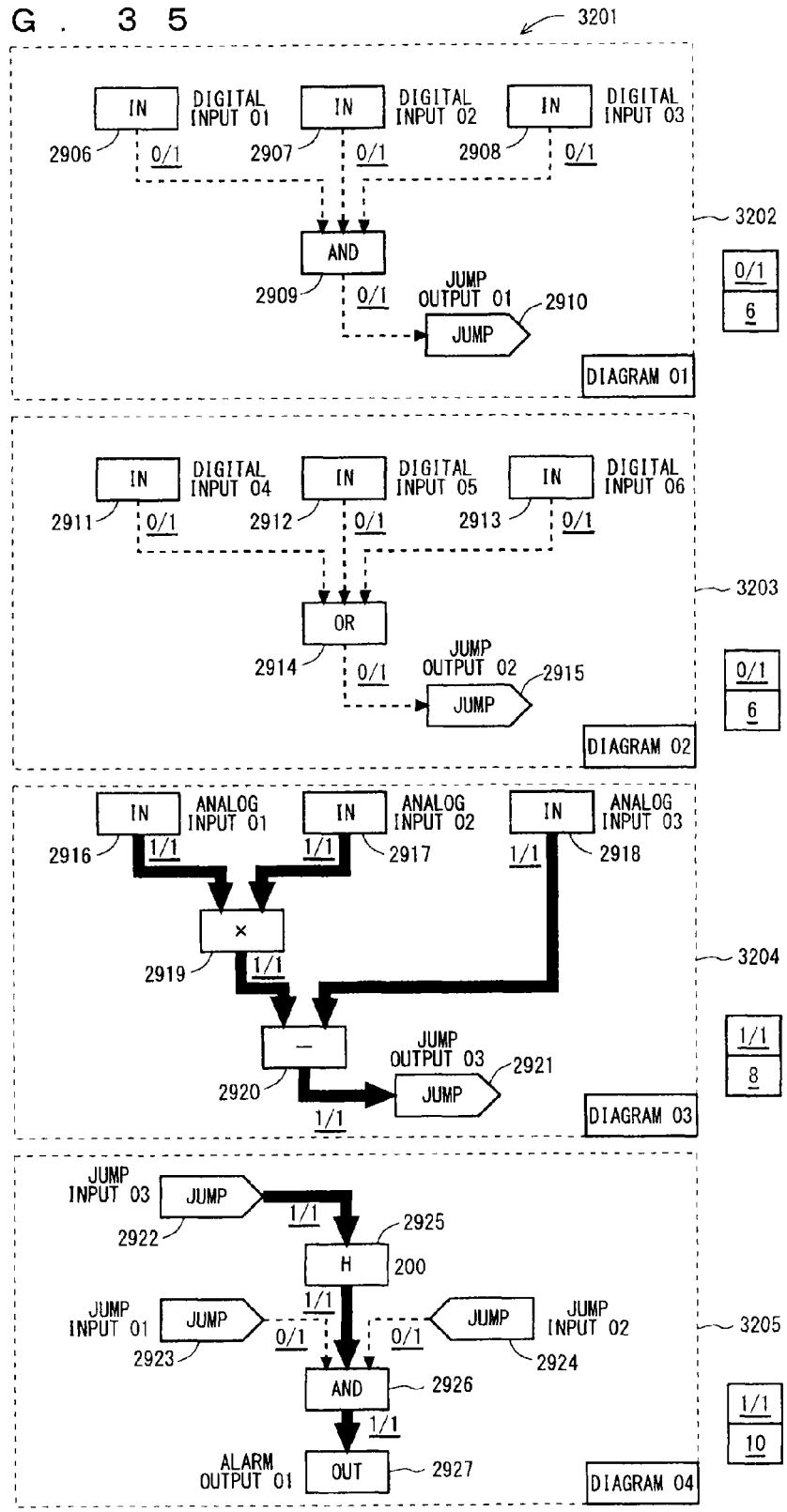
FIG. 35 shows diagram correctness/incorrectness result summarized values and an error probability, of each signal line in the logic diagram.

In this embodiment, the error diagram estimating unit 112 determines that an error probability in a logic diagram becomes higher with a larger diagram correctness/incorrectness result summarized value. If there are logic diagrams of the same diagram correctness/incorrectness result summarized value, the error diagram estimating unit 112 determines that an error probability is higher in a logic diagram of a larger diagram characteristic value. In the example of FIG. 35 where the logic diagrams 3204 and 3205 have a large diagram correctness/incorrectness result summarized value, the error diagram estimating unit 112 determines the logic diagram 3205 of a larger diagram characteristic value to be a logic diagram of the highest error probability.

Figure 37:
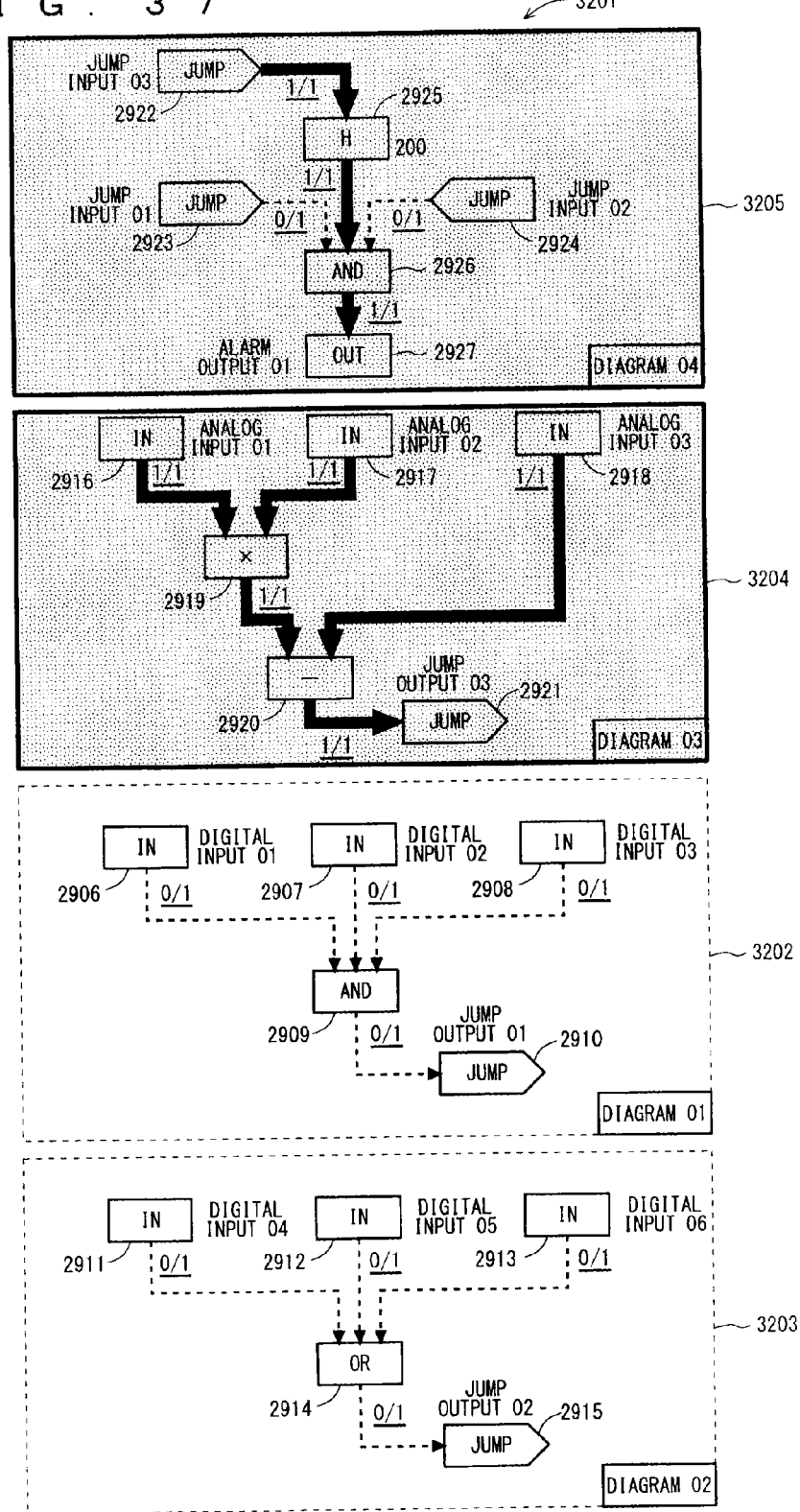
FIG. 37 shows an example of display by a display.

In step S25, the display 109 displays each of the logic diagrams 3202 to 3205 in a display style by which the error probability in each logic diagram estimated by the error diagram estimating unit 112 can be distinguished. The display 109 further displays each signal line in the logic diagrams 3202 to 3205 in a display style by which the error probability in each signal line estimated by the error signal line estimating unit 108 can be distinguished. FIG. 37 shows an example of display of the logic diagrams by the display 109 of the logic diagram display device of this embodiment. The display 109 sorts the logic diagrams in decreasing order of their error probabilities (in the example of FIG. 37, the logic diagrams are sorted from top to bottom), and colors a logic diagram entirely for example in gray with a diagram correctness/incorrectness result summarized value of not "0" (for the convenience of indication, such a logic diagram is given a sand hatch pattern instead of being grayed in FIG. 37). Each signal line is displayed in the same method as that of the first embodiment.

According to the aforementioned logic diagram display device and the method of this embodiment, the diagram correctness/incorrectness result summarizing unit 110 calculates a correctness/incorrectness result summarized value of each logic diagram based on a correctness/incorrectness result summarized value of each signal line calculated by the signal line correctness/incorrectness result summarizing unit 107. The diagram characteristic value calculating unit 111 calculates a diagram characteristic value of each logic diagram. The error diagram estimating unit 112 estimates an error in each logic diagram based on the correctness/incorrectness result summarized value and the diagram characteristic value of each logic diagram. As a result, preparation such as generation of a fault dictionary becomes unnecessary for a plurality of complicated logic diagrams where a control logic is described separately while a logic diagram having an error point can be estimated in a short calculation time.

In this embodiment, a diagram characteristic value of each logic diagram calculated by the diagram characteristic value calculating unit 111 includes an index value indicating the likelihood of mixture of an error into a logic diagram such as the complexity level of this logic diagram. Thus, a logic diagram having an error point can be estimated more appropriately.

Third Embodiment

The diagram characteristic value calculating unit 111 calculates a diagram characteristic value (the complexity level of a logic diagram) based for example on the substance of an arithmetic element in the logic diagram. In the second embodiment, a complexity level is defined for each type of a predetermined arithmetic element, and a diagram characteristic value (the complexity level of a logic diagram) is calculated as the sum of complexity levels according to corresponding types of arithmetic elements in a logic diagram. However, this is given not for limitation. Alternatively, a diagram characteristic value may also be calculated by a method that does not use a complexity level defined for each type of an arithmetic element. As an example, the diagram characteristic value calculating unit 111 may calculate a diagram characteristic value (the complexity level of a logic diagram) as the sum of a total number of input points, a total number of output points, and a total number of configuration parameters of every arithmetic element in a logic diagram as shown by the following formula:

$$\text{Diagram characteristic value} = Ni + No + Np$$

where $Ni$ is a total number of input points of an arithmetic element in a logic diagram, $No$ is a total number of output points of the arithmetic element in the logic diagram, and $Np$ is a total number of configuration parameters of the arithmetic element in the logic diagram.

In this method of calculation, the complexity level of each arithmetic element is defined as the sum of an input point, an output point, and a configuration parameter. A diagram characteristic value of a logic diagram is calculated as the sum of complexity levels of arithmetic elements in the logic diagram.

As an example, an input/output operator such as an input operator, an output operator, or a jump operator has one of an input point and an output point and does not have a configuration parameter, so that the complexity level of such an arithmetic element is "1." As an example, a configuration parameter for an upper limit or a lower limit is used as the configuration parameter mentioned herein. Referring to the arithmetic elements shown in FIG. 36, for example, only the upper limit monitor operator and the lower limit monitor operator have configuration parameters for the upper and lower limits respectively. Thus, the number of configuration parameters of each of the upper and lower limit monitor operators is "1," whereas the number of configuration parameters of the other arithmetic element is "0."

The following describes how diagram characteristic values of the logic diagrams (the complexity levels of the logic diagrams) shown in FIG. 35 are calculated using the aforementioned calculation method. The logic diagram 01 (3202) includes three input operators 2906, 2907 and 2908, one logical AND operator 2909, and one jump operator 2910. The logical AND operator 2909 has three input points and the jump operator 2910 has one input point, so that Ni become 4. The input operators 2906, 2907 and 2908 each have one output point and the logical AND operator 2909 has one output point, so that No becomes 4. As described above, the respective configuration parameters for an input operator, a logical AND operator, and a jump operator are 0, so that Np becomes 0. Thus, a diagram characteristic value of the logic diagram 01 (3202) is calculated to be "8" (=4+4+0). A diagram characteristic value of the logic diagram 02 (3203) is calculated in the same method to be "8" (=4+4+0).

The logic diagram 03 (3204) includes three input operators 2916, 2917 and 2918, the arithmetic element 2919 for multiplication, the arithmetic element 2920 for subtraction, and the jump operator 2921. The arithmetic element 2919 for multiplication has two input points, the arithmetic element 2920 for subtraction has two input points, and the jump operator 2921 has one input point, so that Ni become 5. The input operators 2916, 2917 and 2918 each have one output point, the arithmetic element 2919 for multiplication has one output point, and the arithmetic element 2920 for subtraction has one output point, so that No becomes 5. The respective configuration parameters for an input operator, a logical AND operator, and a jump operator are 0, so that Np becomes 0. Thus, a diagram characteristic value of the logic diagram 03 (3204) is calculated to be "10" (=5+5+0).

The logic diagram 04 (3205) includes three jump operators 2922, 2923 and 2924, an upper limit monitor operator 2925, a logical AND operator 2926, and an output operator 2927. The upper limit monitor operator 2925 has one input point, the logical AND operator 2926 has three input points, and the output operator 2927 has one input point, so that Ni become 5. The jump operators 2922, 2923 and 2924 each have one output point, the upper limit monitor operator 2925 has one output point, and the logical AND operator 2926 has one output point, so that No becomes 5. The configuration parameter for the upper limit monitor operator 2925 is "1," so that Np becomes 1. Thus, a diagram characteristic value of the logic diagram 04 (3205) is calculated to be "11" (=5+5+1).

In the aforementioned example, regarding the logic diagrams 3204 and 3205 having a large diagram correctness/incorrectness result summarized value, the error diagram estimating unit 112 determines the logic diagram 3205 of a larger diagram characteristic value to be a logic diagram of the highest error probability. Then, as in the second embodiment, the logic diagrams are displayed in the display style shown in FIG. 37.

According to the aforementioned embodiment, for estimation of a logic diagram with an error point, a diagram characteristic value can be calculated without defining a complexity level for each type of an arithmetic element.

The embodiment of the present invention can be modified or omitted where appropriate without departing from the scope of the invention.

REFERENCE SIGNS LIST

101 Logic diagram storage
102 Test table storage
105 Signal line correctness/incorrectness determining unit
106 Signal line tracking unit
107 Signal line correctness/incorrectness result summarizing unit
108 Error signal line estimating unit
109 Display
110 Diagram correctness/incorrectness result summarizing unit
111 Diagram characteristic value calculating unit
112 Error diagram estimating unit

The invention claimed is:

1. A device for estimating an error point in a logic diagram including arithmetic elements that perform arithmetic operations and a signal line connecting said arithmetic elements, the device comprising:
   a logic diagram storage that stores said logic diagram;
   a test table storage that stores a test table as a correspondence table of an input value and an output value to each test, for determining whether said logic diagram is correct or incorrect;
   a signal line correctness/incorrectness determining unit that determines for said each test whether each signal line in said logic diagram is correct or incorrect based on a signal line status value of said each signal line and said test table, said signal line status value being acquired for said each test by conducting said each test in said test table on said logic diagram;
   a signal line correctness/incorrectness result summarizing unit that calculates a correctness/incorrectness result summarized value of said each signal line based on a result of determination about the correctness or incorrectness of said each signal line given by said signal line correctness/incorrectness determining unit;
   an error signal line estimating unit that estimates an error in said each signal line based on said correctness/incorrectness result summarized value of said each signal line calculated by said signal line correctness/incorrectness result summarizing unit; and
   a display that displays said each signal line in said logic diagram in a display style responsive to said error in said each signal line estimated by said error signal line estimating unit;
   wherein said signal line correctness/incorrectness determining unit includes a signal line tracking unit that tracks said signal line from an output side toward an input side of said logic diagram based on said signal line status value of said each signal line, said output value in said test table, and a tracking rule determined for each type of said arithmetic elements in said logic diagram,
   wherein said signal line correctness/incorrectness determining unit determines whether said each signal line in said logic diagram is correct or incorrect based on a result of tracking by said signal line tracking unit.

2. A device for estimating an error point in a logic diagram including arithmetic elements that perform arithmetic operations and a signal line connecting said arithmetic elements, the device comprising:
   a logic diagram storage that stores said logic diagram;
   a test table storage that stores a test table as a correspondence table of an input value and an output value to each test, for determining whether said logic diagram is correct or incorrect;
   a signal line correctness/incorrectness determining unit that determines for said each test whether each signal line in said logic diagram is correct or incorrect based on a signal line status value of said each signal line and said test table, said signal line status value being acquired for said each test by conducting said each test in said test table on said logic diagram;
   a signal line correctness/incorrectness result summarizing unit that calculates a correctness/incorrectness result summarized value of said each signal line based on a result of determination about the correctness or incorrectness of said each signal line given by said signal line correctness/incorrectness determining unit;
   a diagram correctness/incorrectness result summarizing unit that calculates a correctness/incorrectness result summarized value of each of plurality of said logic diagrams based on said correctness/incorrectness result summarized value of said each signal line calculated by said signal line correctness/incorrectness result summarizing unit; and
   an error diagram estimating unit that estimates an error in said each logic diagram based on said correctness/incorrectness result summarized value of each said logic diagram calculated by said diagram correctness/incorrectness result summarizing unit;
   an error signal line estimating unit that estimates an error in said each signal line based on said correctness/incorrectness result summarized value of said each signal line calculated by said signal line correctness/incorrectness result summarizing unit; and
   a display that displays said each signal line in said logic diagram in a display style responsive to said error in said each signal line estimated by said error signal line estimating unit;
   wherein said display displays said logic diagram in a display style responsive to said error in said each logic diagram estimated by said error diagram estimating unit.

3. The device for estimating an error point in a logic diagram according to claim 2, further comprising a diagram characteristic value calculating unit that calculates a diagram characteristic value of said each logic diagram,
   wherein said error diagram estimating unit estimates an error in said each logic diagram based on said correctness/incorrectness result summarized value of said each logic diagram calculated by said diagram correctness/incorrectness result summarizing unit and said diagram characteristic value of said each logic diagram calculated by said diagram characteristic value calculating unit.

4. The device for estimating an error point in a logic diagram according to claim 3, wherein said diagram characteristic value of said each logic diagram calculated by said diagram characteristic value calculating unit includes an index value indicating a likelihood of mixture of an error into said each logic diagram.

5. The device for estimating an error point in a logic diagram according to claim 3, wherein said diagram characteristic value calculating unit calculates said diagram characteristic value of said each logic diagram as a sum of a total number of input points, a total number of output points, and a total number of configuration parameters of each of said arithmetic elements in said each logic diagram.

6. A method of estimating an error point in logic diagram, that estimates an error point in a logic diagram including arithmetic elements that perform arithmetic operation and a signal line connecting said arithmetic elements, the method comprising:
   (a) a step of acquiring a signal line status value of each signal line in said logic diagram by conducting each test in a test table on said logic diagram, said test table being a correspondence table of an input value and an output value to said each test, for determining whether said logic diagram is correct or incorrect;
   (b) a step of tracking said signal line from an output side toward an input side of said logic diagram based on said signal line status value of said each signal line, said output value in said test table, and a tracking rule determined for each type of said arithmetic elements in said logic diagram, and determining for said each test whether said each signal line is correct or incorrect based on a result of tracking by said signal line tracking unit;

(c) a step of calculating a correctness/incorrectness result summarized value of said each signal line based on a result of determination about the correctness or incorrectness of said each signal line given in said step (b);

(d) a step of estimating an error in said each signal line based on said correctness/incorrectness result summarized value of said each signal line calculated in said step (c); and (e) a step of displaying said each signal line in said logic diagram in a display style responsive to said error in said each signal line estimated in said step (d).

7. A method of estimating an error point in logic diagram, that estimates an error point in a logic diagram including arithmetic elements that perform arithmetic operation and a signal line connecting said arithmetic elements, the method comprising:

(a) a step of acquiring a signal line status value of each signal line in said logic diagram by conducting each test in a test table on said logic diagram, said test table being a correspondence table of an input value and an output value to said each test, for determining whether said logic diagram is correct or incorrect;

(b) a step of determining for said each test whether said each signal line is correct or incorrect based on said signal line status value acquired in said step (a) and said test table;

(c) a step of calculating a correctness/incorrectness result summarized value of said each signal line based on a result of determination about the correctness or incorrectness of said each signal line given in said step (b);

(d) a step of estimating an error in said each signal line based on said correctness/incorrectness result summarized value of said each signal line calculated in said step (c);

(e) a step of calculating a correctness/incorrectness result summarized value of each of plurality of said logic diagrams based on said correctness/incorrectness result summarized value of said each signal line calculated in step (d); and (f) a step of estimating an error in said each logic diagram based on said correctness/incorrectness result summarized value of each said logic diagram calculated in step (e); and (g) a step of displaying said each signal line in said logic diagram in a display style responsive to said error in said each signal line estimated in said step (d), wherein step (g) includes displaying said logic diagram in a display style responsive to said error in said each logic diagram estimated in step (f).

* * * * *